(12) United States Patent
Mann

(10) Patent No.: US 8,717,538 B2
(45) Date of Patent: May 6, 2014

(54) CATOPTRIC IMAGING OPTICAL SYSTEM WITH AN ARC-SHAPED OBJECT FIELD

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 391 days.

(21) Appl. No.: 12/767,574

(22) Filed: Apr. 26, 2010

(65) Prior Publication Data

US 2010/0231886 A1    Sep. 16, 2010

Related U.S. Application Data

(63) Continuation of application No. PCT/EP2008/008886, filed on Oct. 21, 2008.

(30) Foreign Application Priority Data

Oct. 26, 2007   (DE) .................... 10 2007 051 668

(51) Int. Cl.
*G03B 27/54*   (2006.01)

(52) U.S. Cl.
USPC ............................................................ 355/67

(58) Field of Classification Search
None
See application file for complete search history.

(56) References Cited

U.S. PATENT DOCUMENTS

| | | |
|---|---|---|
| 4,804,258 A | 2/1989 | Kebo |
| 5,815,310 A | 9/1998 | Williamson |
| 6,172,825 B1 | 1/2001 | Takahashi |
| 6,750,948 B2 | 6/2004 | Omura |
| 7,050,152 B2 | 5/2006 | Terashima et al. |
| 7,209,286 B2 | 4/2007 | Mann et al. |
| 7,626,770 B2 | 12/2009 | Singer et al. |
| 7,682,031 B2 | 3/2010 | Mann et al. |
| 2002/0056815 A1 | 5/2002 | Mann et al. |
| 2002/0154395 A1 | 10/2002 | Mann et al. |
| 2003/0021026 A1 | 1/2003 | Allan et al. |
| 2004/0057134 A1 | 3/2004 | Dinger |
| 2005/0122498 A1 | 6/2005 | Jasper |
| 2005/0173653 A1 | 8/2005 | Yamada |

(Continued)

FOREIGN PATENT DOCUMENTS

| | | |
|---|---|---|
| CN | 1 612 052 A | 5/2005 |
| DE | 10 2005 042 005 | 7/2006 |

(Continued)

OTHER PUBLICATIONS

Hudyma, "An Overview of Optical Systems for 30 nm Resolution Lithography at EUV Wavelengths," Proc. of SPIE, vol. 4832, Dec. 1, 2002, pp. 137-148.

(Continued)

*Primary Examiner* — Peter B Kim
*Assistant Examiner* — Michelle Iacoletti
(74) *Attorney, Agent, or Firm* — Fish & Richardson P.C.

(57) ABSTRACT

In certain aspects, imaging optical systems with a plurality of mirrors image an object field in an object plane into an image field in an image plane. In the light path between non-obscured mirrors, imaging rays pass through at least one multiple pass-through region between spaced-apart planes which are arranged parallel to the object plane and/or parallel to the image plane. The imaging optical systems have at least one pupil plane. The pupil plane is arranged outside the multiple pass-through region between the non-obscured mirrors. This can provide an imaging optical system which provides for an easier correction of image errors.

26 Claims, 15 Drawing Sheets

(56) References Cited

U.S. PATENT DOCUMENTS

| | | |
|---|---|---|
| 2006/0098273 A1* | 5/2006 | Takahashi .................... 359/365 |
| 2006/0232867 A1 | 10/2006 | Mann et al. |
| 2007/0236784 A1 | 10/2007 | Singer et al. |
| 2008/0316451 A1 | 12/2008 | Mann et al. |
| 2010/0231885 A1 | 9/2010 | Mann |
| 2010/0265481 A1 | 10/2010 | Mann |

FOREIGN PATENT DOCUMENTS

| | | |
|---|---|---|
| DE | 10 2006 017 336 | 10/2007 |
| EP | 0 267 766 | 5/1988 |
| EP | 0 689 075 | 12/1995 |
| EP | 0 799 528 | 1/2001 |
| EP | 1 093 021 | 4/2001 |
| EP | 1 093 031 | 4/2001 |
| EP | 1 434 093 | 6/2004 |
| EP | 1 930 771 | 6/2008 |
| EP | 1 825 315 | 10/2008 |
| JP | 9-211332 | 8/1997 |
| JP | 09 213618 | 8/1997 |
| JP | 2000-100694 | 4/2000 |
| JP | 2001-185480 | 7/2001 |
| JP | 2007-514192 | 5/2007 |
| WO | WO 96/19871 | 6/1996 |
| WO | 2005/059617 | 6/2005 |
| WO | WO 2005/098506 | 10/2005 |
| WO | WO 2006/063605 | 6/2006 |
| WO | WO 2006/069725 | 7/2006 |
| WO | WO 2006/119977 | 11/2006 |
| WO | WO 2009/052932 | 4/2009 |
| WO | WO 2009/052962 | 4/2009 |

OTHER PUBLICATIONS

D.A. Tichenor et al., "EUV Engineering Test Stand", Lawrence Livermore National Laboratory, 14.02.2000, Figs. 6 (preprint UCRL-JC-137668).

English translation and Japanese Office Action, for corresponding Japanese patent application No. JP 2010-530321, dated Dec. 20, 2012.

* cited by examiner ature of the invention features a projection of this application is a continuation application of a continuation of the imaging optical system can enable the non-
CATOPTRIC IMAGING OPTICAL SYSTEM WITH AN ARC-SHAPED OBJECT FIELD

CROSS-REFERENCE TO RELATED APPLICATIONS

This application is a continuation application of and claims priority to PCT/EP 2008/008886, filed on Oct. 21, 2008, which claims benefit of German Applicant No. 10 2007 051 668.3, filed on Oct. 26, 2007. The entire contents of the above-mentioned applications are hereby incorporated by reference.

BACKGROUND

Imaging optical systems are disclosed, for example, in U.S. Pat. No. 6,750,948 B2, US 2006/0232867 A1, EP 0 267 766 A2, U.S. Pat. No. 7,209,286 B2 and WO 2006/069725 A1. WO 2005/098506 A1 discloses, for example, a catadioptric imaging optical system with a minimum ring field radius.

SUMMARY

In general, in a first aspect, the invention features an imaging optical system with a plurality of mirrors which image an object field in an object plane into an image field in an image plane, where imaging rays in the light path between non-obscured mirrors of the imaging optical system pass several times through at least one multiple pass-through region between spaced-apart planes which are arranged parallel to the object plane and/or parallel to the image plane, and where the imaging optical system includes at least one pupil plane.

In general, in another aspect, the invention features a catoptric imaging optical system with a plurality of mirrors which image an object field in an object plane into an image field in an image plane, where the object field has the shape of an arc field which is delimited by two graduated circles with the same radius which are displaced parallel to each other by a distance, and two boundary lines respectively connecting the two ends of both graduated circles.

In general, in a further aspect, the invention features an imaging optical system with a plurality of mirrors, which image an object field in an object plane into an image field in an image plane, where the imaging optical system includes an optical axis, and at least one non-obscured mirror group which is spatially arranged between one of the following types of boundary planes of the imaging optical system: between a field plane and a pupil plane arranged directly downstream thereof, or between a first pupil plane and a second pupil plane arranged directly downstream thereof.

In another aspect, the invention features a projection exposure apparatus including an imaging optical system of one of the aforementioned aspects, a method for the production of a microstructured component using the projection exposure apparatus, and to a microstructured component produced by this method.

In general, in another aspect, the invention features an imaging optical system with a plurality of mirrors, which image an object field in an object plane into an image field in an image plane, where imaging rays in the light path between non-obscured mirrors of the imaging optical system pass several times through at least one multiple pass-through region between spaced-apart planes which are arranged parallel to the object plane and/or parallel to the image plane, and where the imaging optical system includes at least one pupil plane, where all pupil planes are arranged outside the multiple pass-through regions between the non-obscured mirrors.

By arranging the at least one pupil plane of the imaging optical system outside multiple pass-through regions in the light path between non-obscured mirrors, this enables the imaging optical system to be designed with an arc-shaped object field having a small field radius without causing vignetting problems between the mirrors of the imaging optical system. The small field radius results in that for a given field size, the object field is arranged close to the optical axis of the imaging optical system. This facilitates the correction of image errors of the imaging optical system as higher aspheric orders, which can be required for regions remote from the axis, as well as higher asphericities can be dispensed with. The mirrors of the imaging optical system can therefore be designed such that the reflection surfaces thereof slightly deviate from spherical surfaces. For instance, it is conceivable to design the imaging optical system in a way that even for systems with a numerical aperture in the range of 0.5, the maximum deviation of the reflection surfaces of a sphere which is best fitted to the reflection surfaces is less than 500 µm, e.g., less than 200 µm. Furthermore, this facilitates the interferometric test as the diameter of the parent asphere is reduced. The parent diameter of a mirror is defined in the professional article "EUV Engineering Test Stand" by D. A. Tichenor et al., Lawrence Livermore National Laboratory, 14.02.2000, FIG. 6 (preprint UCRL-JC-137668). The imaging optical systems disclosed herein can enable the non-obscured mirrors to be designed without vignetting despite the small field radii as the imaging ray bundles, which proceed from the arc-shaped object field and which are correspondingly arc-shaped in a direction perpendicular to the optical axis, have arc shapes in planes which are perpendicular to the optical axis and which are passed through by imaging light several times, said arc shapes opening in the same direction. Arc-shaped bundles of this type can easily be configured such that they lie next to each other at an approximately constant distance from each other; in a plane which is perpendicular to the optical axis and is passed through by imaging light several times, it is therefore possible to easily separate a reflected bundle from an arc-shaped bundle which is able to pass through. The at least one pupil plane is arranged outside the multiple pass-through regions such that the pupil plane does not coincide with reflection surfaces delimiting the multiple pass-through regions. This can ensure that there is no pupil plane in the light path of the multiple pass-through regions. The imaging optical system can be a catoptric optical system as well as, in principle, a catadioptric optical system. If the imaging optical system is equipped with more than one pupil plane, all these pupil planes may be disposed in the light path between non-obscured mirrors outside multiple pass-through regions. All these pupil planes are then arranged outside the multiple pass-through regions such as to ensure that the pupil planes do not coincide with reflection surfaces which delimit multiple pass-through regions so that the edges thereof are still part of the multiple pass-through regions.

In the light path between obscured mirrors, the imaging rays can pass several times through at least another multiple pass-through region between spaced-apart planes which are parallel to the object plane and/or parallel to the image plane, wherein at least one pupil plane, e.g., all pupil planes, is/are arranged outside those multiple pass-through regions between the non-obscured mirrors and those multiple pass-through regions between the obscured mirrors. This arrangement of the at least one pupil plane of the imaging optical system can ensure accessibility of an illumination bundle in this pupil plane.

The object field can have the shape of an arc field which is delimited by two graduated circular arcs with the same radius, said graduated arcs being displaced parallel to each other by a certain distance. The field is also delimited by two boundary lines respectively connecting the two ends of both graduated arcs, wherein this arc field can subtend an azimuth angle of more than 75°. Arc fields of this type can have an advantageously low arc field radius at a given field size. The azimuth angle can be greater than 80°, than 90°, than 100°, than 110°, than 120°, than 130°, than 140°, than 150°, than greater than 170°. At a given distance of the two graduated circular arcs, which is referred to as scanning slot length in a scanning projection exposure apparatus, and a given width of the arc field, which is referred to as scanning slot width in a scanning projection exposure apparatus, the azimuth angle can have a size of up to the theoretical maximum.

In a further aspect, the invention features an imaging optical system with a plurality of mirrors which image an object field in an object plane into an image field in an image plane, where the imaging optical system has an optical axis, the imaging optical system has at least one group of non-obscured mirrors which is spatially arranged between one of the following types of boundary planes of the imaging optical system: between a field plane and a pupil plane arranged directly downstream thereof; or between a first pupil plane and a second pupil plane arranged directly downstream thereof.

The field or pupil planes, respectively, delimiting at least one group of non-obscured mirrors can be in turn arranged outside this non-obscured mirror group such that these delimiting field or pupil planes, respectively, do not coincide with reflection surfaces which delimit an extension of the at least one non-obscured mirror group along the optical axis. The field or pupil planes, respectively, delimiting the at least one non-obscured mirror group therefore may lie at a distance from the at least one non-obscured mirror group disposed therebetween.

The imaging optical system can be designed in a way that a principal ray, which proceeds from a central object field point and passes through the center of pupils in the pupil planes of the imaging optical system, proceeds in the meridional section between mirrors of the at least one non-obscured mirror group of the imaging optical system such that it does not pass through a principal separation plane in which lies the optical axis and on which the normal from a central object field point to the optical axis is perpendicular.

The imaging optical system can have a central pupil obscuration, in other words an arrangement which does not allow imaging rays to pass through a region of a pupil plane which is surrounded by another region in which a passage of imaging rays is possible.

A pupil obscuration of this type can but need not necessarily be configured as a central pupil obscuration. It is sufficient to provide a region in a region of the pupil plane, which is otherwise passed through by imaging rays, which cannot be passed through by imaging rays.

The object field and the image field can be arranged at a distance from the optical axis.

The imaging optical system can enable non-obscured mirror groups to be provided on both sides of the principal separation plane without leading to the occurrence of vignetting problems as the separation by means of the pupil plane between the non-obscured mirror groups ensures a separation of the various arc-shaped imaging light bundles in planes which are perpendicular to the optical axis of the imaging optical system and which are passed through by illumination light several times.

The imaging optical system can be designed in a way that imaging rays in the light path between non-obscured mirrors pass several times through at least one multiple pass-through region between spaced-apart planes which are arranged parallel to the object plane and/or parallel to the image plane, and in the meridional section, the imaging rays between these planes delimiting the multiple pass-through region do not pass through the principal separation plane.

A design of this type can enable imaging ray bundles to be separated particularly well in planes passed through by imaging light several times.

In some embodiments, the imaging optical system has a plurality of mirrors which image an object field in an object plane into an image field in an image plane, wherein the imaging optical system has at least four mirrors of which at least two are non-obscured, and wherein the non-obscured mirror is designed as a spherical mirror. In a design of this type, a spherical mirror can be used which is fabricable in a comparatively cost-effective way. It has been found that such an arrangement is possible in particular when using a small ring field radius.

In certain embodiments, the imaging optical system hashave several non-obscured mirror groups between which in each case one pupil plane is arranged in the imaging light path. Such an arrangement may ensure that the pupil plane separating the non-obscured systems is in any case disposed in a region of the imaging optical system which is passed through by imaging light only once, in other words not in a multiple pass-through region.

At least one obscured mirror with an opening for the passage of imaging light may facilitate the construction of the imaging optical system in terms of minimizing the maximum angle.

The imaging optical system can include exactly six mirrors of which at least three mirrors, e.g., exactly four mirrors, are obscured. In some embodiments, the imaging optical system includes exactly eight mirrors of which at least three mirrors, e.g., exactly four mirrors, are obscured. The imaging optical system can include exactly ten mirrors of which at least three mirrors, e.g., exactly four mirrors, are obscured. Such designs may be particularly suitable for minimizing the ratio of the maximum angle of incidence and the image-side numerical aperture.

Embodiments of the imaging optical systems may include one or more of the features discussed above in combinations other than those claimed.

Embodiments of imaging optical systems can be used in projection exposure apparatus. The light source of the projection exposure apparatus may be configured so as to be broadband and may for example have a bandwidth which is greater than 1 nm, greater than 10 nm or greater than 100 nm. Additionally, the projection exposure apparatus may be configured so as to be able to be operated with light sources of different wavelengths. Light sources for other wavelengths, in particular those wavelengths used for microlithography, may also be used in combination with the imaging optical systems discussed above with respect to various aspects of the invention, for example light sources with wavelengths of 365 nm, 248 nm, 193 nm, 157 nm, 126 nm, 109 nm and, in particular, also with wavelengths which are less than 100 nm, for instance between 5 nm and 30 nm.

The light source of the projection exposure apparatus may be configured such as to generate illumination light with a wavelength of between 5 nm and 30 nm. A light source of this type may require reflective coatings on the mirrors, which have only a small acceptance bandwidth for the angle of incidence, in order to achieve minimum reflectivity. Together with the imaging optical system, a low acceptance bandwidth for the angle of incidence can be fulfilled.

A production method and the microstructured or component produced thereby may have corresponding advantages.

BRIEF DESCRIPTION OF THE DRAWINGS

In the following, embodiments are described in greater detail by means of the drawings, in which.

DETAILED DESCRIPTION

Figure 1:
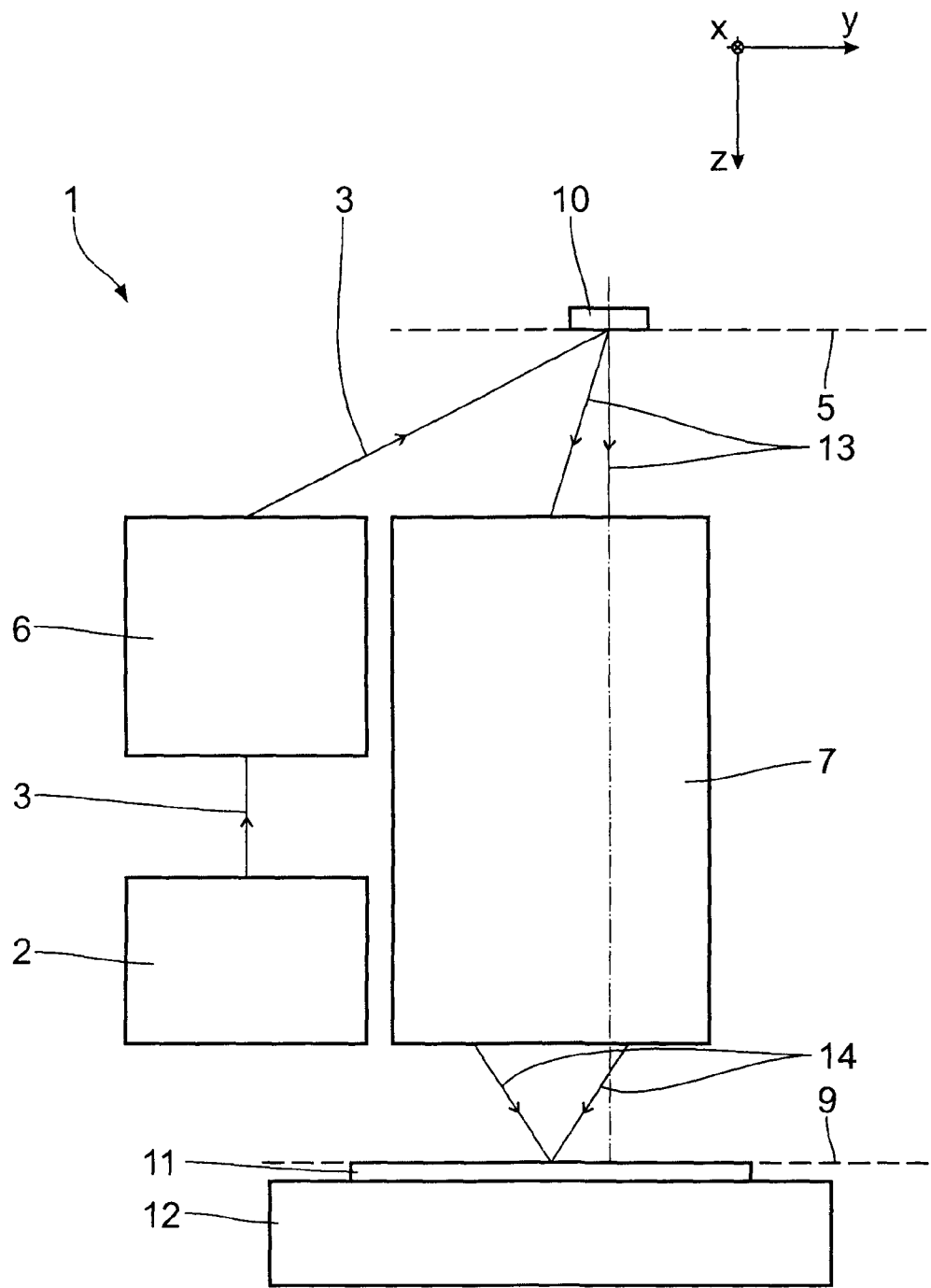
FIG. 1 is a schematic view of an embodiment of a projection exposure apparatus for EUV microlithography.

Referring to FIG. 1, a projection exposure apparatus 1 for microlithography has a light source 2 for illumination light or illumination radiation 3. The light source 2 is an EUV light source, which produces light in a wavelength range, for example, between 5 nm and 30 nm, in particular between 5 nm and 10 nm. The light source 2 may in particular be a light source with a wavelength of 6.9 nm. Other EUV wavelengths are also possible. In general, any desired wavelengths, for example visible wavelengths or even other wavelengths which may be used in microlithography and for which suitable laser light sources and/or LED light sources are available (for example 365 nm, 248 nm, 193 nm, 157 nm 129 nm, 109 nm), are possible for the illumination light 3 which is guided in the projection exposure apparatus 1. A light path of the illumination light 3 is shown extremely schematically in FIG. 1.

An illumination optics 6 guides the illumination light 3 from the light source 2 to an object field 4 (cf. FIG. 3) in an object plane 5. The object field 4 is imaged into an image field 8 (cf. FIG. 2) in an image plane 9 at a predetermined reduction scale by a projection optical system or imaging optical system 7. One of the embodiments shown in FIG. 2 and the following may be used for the projection optical system 7. The projection optical system 7 according to FIG. 2 has a reduction factor of 8. Other reduction scales are also possible, for example 4×, 5×, or even reduction scales which are greater than 8×. For illumination light 3 with an EUV wavelength, an imaging scale of 8× is particularly suitable, because an object-side angle of incidence on a reflection mask 10 can thus remain small. Also, an imaging scale of 8× may not require the use of unnecessarily large masks. In the projection optical system 7 in the embodiments according to FIG. 2 and the following, the image plane 9 is arranged parallel to the object plane 5. In this way, a portion, coinciding with the object field 4, of the reflection mask 10 which is also referred to as a reticle is imaged.

The imaging performed by the projection optical system 7 takes places on the surface of a substrate 11 in the form of wafer which is supported by a substrate support 12. FIG. 1 schematically shows between the reticle 10 and the projection optical system 7 a light beam 13 of the illumination light 3 entering said projection optical system, and between the projection optical system and the substrate 11, a light beam 14 of the illumination light 3 exiting the projection optical system 7. The numerical aperture of the projection optical 7 on the image field side is 0.40 in accordance with FIG. 2. This is not shown to scale in FIG. 1.

In order to aid the description of the projection exposure apparatus 1 and the various embodiments of the projection optical system 7, an xyz system, which shows the respective locations of the components represented in the figures may be taken, is specified in the drawings. In FIG. 1, the x direction extends perpendicular to and into the drawing plane. The y direction extends to the right and the z direction extends downwards.

The projection exposure apparatus 1 is a scanner-type device. Both the reticle 10 and the substrate 11 are scanned in the y direction during the operation of the projection exposure apparatus 1. A stepper type device for the projection exposure apparatus 1, in which a stepwise displacement of the reticle 10 and of the substrate 11 in the y direction takes place between individual exposures of the substrate 11, is also possible.

Figure 2:
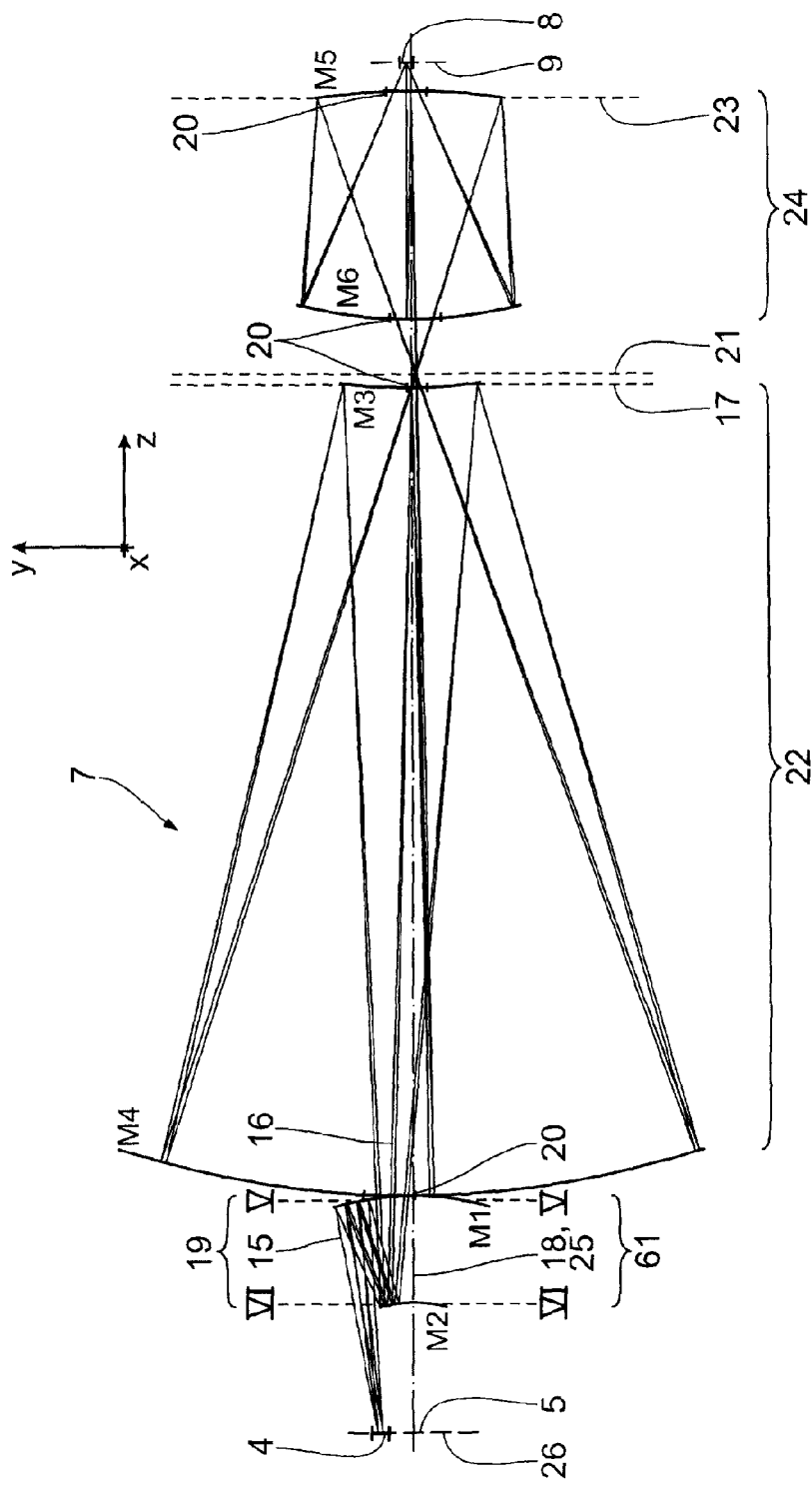
FIG. 2 is a meridional section of an embodiment of an imaging optical system of the projection exposure apparatus.

FIG. 2 shows the optical construction of a first embodiment of the projection optical system 7. This shows the light path of each of three individual rays 15, which proceed in each case from two object field points, which are spaced from one another in the y direction in FIG. 2. The three individual rays 15, which belong to one of these two object field points, are each associated with three different illumination directions for the two object field points. Principal rays 16, which extend through the centre of a pupil in a pupil plane 17 of the projection optical system 7, are shown in FIG. 2 only for reasons of clarity, as these are not real imaging light paths of the projection optical system 7 due to the central pupil obscuration. Proceeding from the object plane 5, these principal rays 16 initially extend divergently. This is referred to in the following as a negative back focal length of an entrance pupil of the projection optical system 7. The entrance pupil of the projection optical system 7 according to FIG. 2 lies not inside the projection optical system 7, but before the object plane 5 in the light path. This makes it possible, for example, to arrange a pupil component of the illumination optics 6 in the entrance pupil of the projection optical system 7 before the projection optical system 7 in the light path, without further imaging optical components having to be present between this pupil component and the object plane 5. As an alternative, a positive back focal length of the entrance pupil, or an object-side telecentric light path as a further alternative, is also possible. The second alternative is used, for example, in relation to a reflection mask as a reticle 10 in the object plane 5 with the use of a ray divider element or in conjunction with a transmission mask as a reticle in the object plane 5.

The projection optical system 7 according to FIG. 2 has a total of six mirrors, which are numbered M1 to M6 in the sequence of the light path of the individual rays 15, starting from the object field 4. FIG. 2 shows merely the calculated reflection surfaces of the mirrors M1 to M6. In general, the mirrors M1 to M6 are larger than the reflection surfaces which are actually used.

The optical data of the projection optical system 7 according to FIG. 2 are shown below by means of two tables. In the "radius" column, the first table shows the respective radii of curvature of the mirrors M1 to M6. The third column (thickness) describes the distance in each case to the following surface in the z direction starting from the object plane 5.

The second table describes the precise surface shape of the reflection surfaces of the mirrors M1 to M6, where the constants K and A to E are to be used in the following equation for the sagittal height z:

$$z(h) == \frac{ch^2}{1 + SQRT\{1 - (1 + K)c^2h^2\}} + +Ah^4 + Bh^6 + Ch^8 + Dh^{10} + Eh^{12}$$

Here, h represents the distance of the projection optical system 7 from an optical axis 18. Therefore, $h^2 = x^2 + y^2$. The reciprocal of the radius is used for c.

| Surface | Radius (1/c) | Thickness | Operating mode |
|---|---|---|---|
| Object plane | INFINITY | 348.222 | |
| M1 | −379.407 | −157.578 | REFL |
| M2 | −202.767 | 1353.319 | REFL |
| DIAPHRAGM | INFINITY | 0.000 | |
| M3 | 1127.182 | −1195.630 | REFL |
| M4 | 1374.690 | 1626.377 | REFL |
| M5 | −975.061 | −330.747 | REFL |
| M6 | 681.443 | 375.745 | REFL |
| Image plane | INFINITY | 0.000 | |

| Surface | K | A | B |
|---|---|---|---|
| M1 | 0.000000E+00 | −6.780209E−11 | −1.455553E−15 |
| M2 | 0.000000E+00 | 2.307286E−09 | 2.337524E−14 |
| M3 | 0.000000E+00 | 1.500225E−09 | 1.781600E−14 |
| M4 | 0.000000E+00 | −1.573831E−12 | −8.140292E−19 |
| M5 | 0.000000E+00 | 6.446612E−10 | 2.597249E−15 |
| M6 | 0.000000E+00 | 3.799673E−10 | 1.680031E−15 |

| Surface | C | D | E |
|---|---|---|---|
| M1 | −3.423358E−21 | 0.000000E+00 | 0.000000E+00 |
| M2 | 5.367802E−18 | 0.000000E+00 | 0.000000E+00 |
| M3 | −2.232896E−19 | 0.000000E+00 | 0.000000E+00 |
| M4 | −5.798511E−26 | 0.000000E+00 | 0.000000E+00 |
| M5 | 4.409975E−20 | 1.865473E−25 | −9.721913E−32 |
| M6 | 5.791990E−21 | 0.000000E+00 | 0.000000E+00 |

The mirrors M1 and M2 of a first mirror group 19 are used in the shape of a ring segment and off-axis in relation to the optical axis 18. The used optical reflection surface of the mirrors M1 and M2 thus lies at a distance from the optical axis 18. The object field 4 and the image field 8 are arranged at a distance from the optical axis 18. The reflection surfaces of all the mirrors M1 to M6 are rotationally symmetrical about the optical axis 18 in accordance with the above equation for the sagittal height z.

The optically used regions of the mirrors M1 and M2 have no through-openings for the penetration of imaging light, i.e. are not obscured. The first mirror group 19 is thus a non-obscured mirror group. The reflection surfaces of the mirrors M1 and M2 face one another.

The mirrors M1, M4, M5 and M6 are concave mirrors. The mirrors M2 and M3 are convex mirrors.

The individual rays 15 pass through a through-opening 20 in the mirror M4 between the mirrors M2 and M3 in the imaging light path. The mirror M4 is used around the through-opening 20. The mirror M4 is thus an obscured mirror. As well as the mirror M4, the mirrors M3, M5 and M6 are also obscured and likewise each comprise an approximately central through-opening 20. In total, two non-obscured mirrors, namely the mirrors M1 and M2, and then four obscured mirrors, namely the mirrors M3 to M6, are thus initially present in the projection optical system 7.

The pupil plane 17 lies in the light path in the projection optical system 7 in the region of the reflection of the individual rays 15 on the mirror M3.

The mirrors M1 and M4 are arranged back-to-back as regards the orientation of the reflection surfaces thereof.

Between the mirrors M4 and M5 in the imaging light path lies an intermediate image plane 21 of the projection optical system 7. The individual rays 15 penetrate the intermediate image plane 21 directly after the individual rays 15 pass through the through-opening 20 of the mirror M3.

The mirrors M3 and M4 represent a first obscured mirror group 22 of the projection optical system 7 between the pupil plane 17 and the intermediate image plane 21, which is arranged after the non-obscured mirror group 19 in the imaging light path. The reflection surfaces of the mirrors M3 and M4 face one another.

The individual rays 15 penetrate the through-opening 20 in the mirror M6 between the intermediate image plane 21 and the mirror M5 in the light path. A further pupil plane 23 of the projection optical system 7 is present in the region of the reflection of the individual rays 15 on the mirror M5.

The mirrors M5 and M6 represent a further obscured mirror group 24 of the projection optical system 7 between the intermediate image plane 20 and the image plane 9, which is arranged after the obscured mirror group 22. The reflection surfaces of the mirrors M5 and M6 face one another.

After the reflection of individual rays 15 on the mirror M6, the individual rays 15 pass through the through-opening 20 in the mirror M5 and reach the image field 8. The following table shows the maximum and minimum angles of incidence for the individual rays 15 in the meridional section according to FIG. 2. These are the respective maximum and minimum angles of incidence on the mirrors M1 to M6.

| Mirror | Max. angle of incidence (meridional section) [°] | Min. angle of incidence (meridional section) [°] |
| --- | --- | --- |
| M1 | 7.52 | 5.87 |
| M2 | 12.35 | 9.16 |
| M3 | 10.38 | 0.81 |
| M4 | 2.35 | 0.42 |
| M5 | 12.10 | 1.66 |
| M6 | 10.41 | 2.19 |

The ratio of the maximum angle of incidence of imaging light onto the reflection surfaces of the mirrors M1 to M6 and the numerical aperture of the projection optical system 7 is thus specified by the maximum angle of incidence onto the mirror M2, which is 12.35°. The ratio of this maximum angle of incidence and the numerical aperture is thus 30.9° in the projection optical system 7 according to FIG. 2.

The low maximum angle of incidence provides the possibility of using a reflection surface even for low EUV wavelengths, for example in the range of 6.9 nm, which have a comparatively large acceptance bandwidth for the angle of incidence because of the low maximum angle of incidence. This is further explained below by means of FIG. 14. This acceptance bandwidth of the reflective layer for the angle of incidence increases as the maximum angle of incidence for which the reflective coating is constructed decreases. Reflective coatings which are formed as a layer stack with a large number of, in particular, successively alternating layer materials with different refractive indexes are also possible. When illumination light 3 with a wavelength of less than 10 nm is used, coatings of this type have a correspondingly low acceptance bandwidth for the angle of incidence. The projection optical system 7 can therefore be used with relatively low reflection losses by comparison with the state of the art and with smaller differences in the reflectivity of the individual mirrors over the reflection surfaces thereof even at low wavelengths of this type.

The optical axis 18 is shown as a broken line in FIG. 2. This broken line simultaneously represents the line of intersection of a principal separation plane 25 (xz plane in FIG. 2) with the meridional plane (yz plane in FIG. 2) according to FIG. 2. This principal separation plane 25 is perpendicular to the drawing plane in FIG. 2. The optical axis 18 lies in the principal separation plane 25. Additionally, a normal 26 of a central object field point, lying in the meridional plane of FIG. 2, on the optical axis 18 is perpendicular to the principal separation plane 25. This normal 26 also lies in the drawing plane of FIG. 2 and coincides with the line of intersection of the object plane 5 (xy plane in FIG. 2) with the meridional plane, i.e. the drawing plane in FIG. 2.

The imaging rays, extending in the meridional section, of the optical system do not pass through the principal separation plane 25 in the first, non-obscured mirror group 19 of the projection optical system 7. The principal separation plane 25 is first passed through by individual rays 15 after the reflection on the mirror M2 between the mirrors M2 and M3 in the imaging light path, i.e. at the transition between the mirror groups 19 and 22. The principal separation plane 25 is first passed through by the principal rays 16 in the pupil plane 17.

Figure 3:
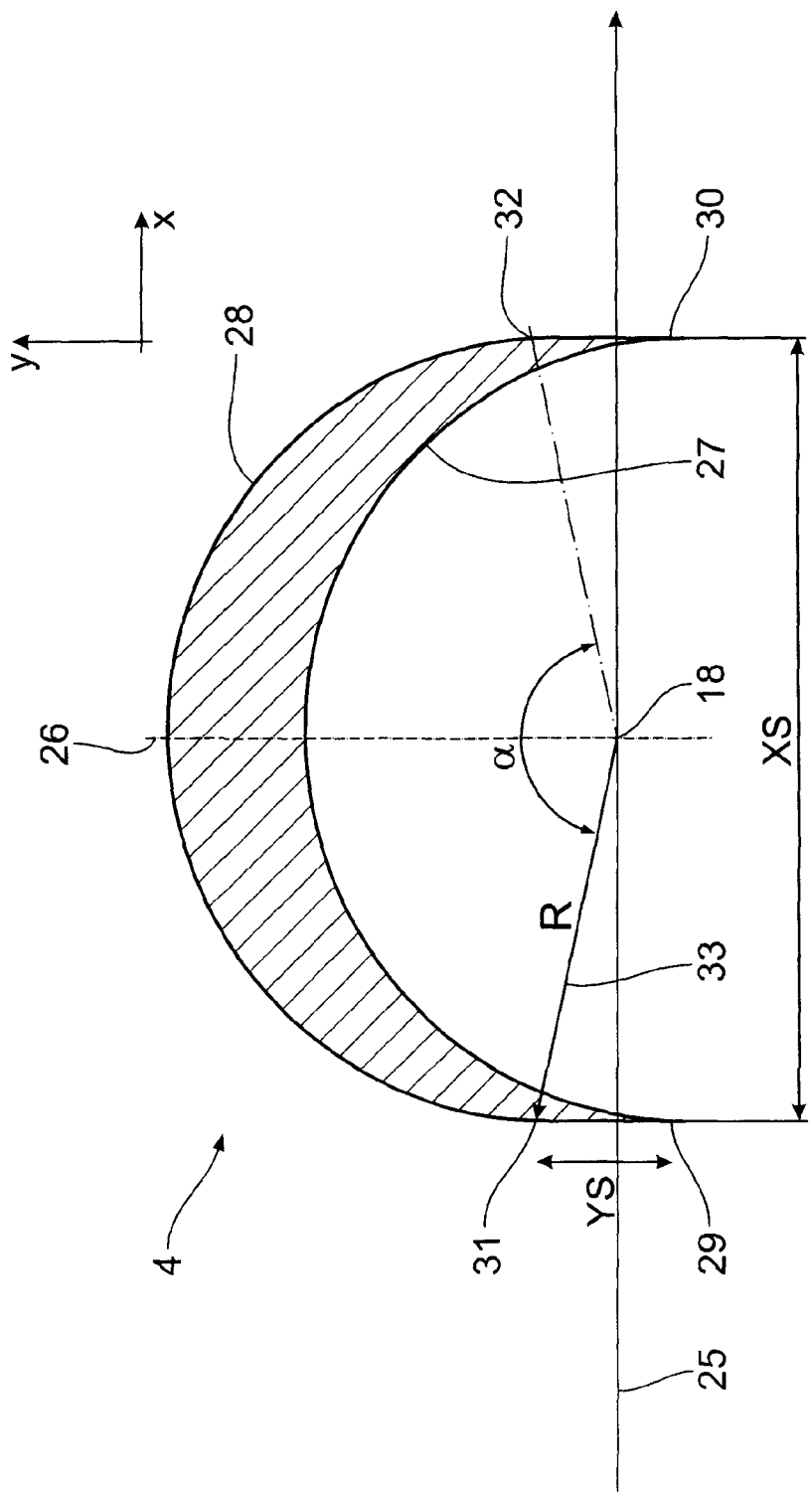
FIG. 3 is an enlarged view of an object field of the imaging optical system according to FIG. 2.

FIG. 3 is an enlarged view of the object field 4 of the projection optical system 7. The image field 8 has exactly the same shape except that it is reduced by a factor of 8. The field 4 is an arc-shaped field, which is delimited by two graduated circles 27, 28 of the same radius R, which are displaced parallel to one another in the y direction by a distance YS. The field 4 is also delimited by two boundary lines 29, 30 respectively connecting the two ends of the graduated circles 27, 28 and extending parallel to the normal 26. The two boundary lines 29, 30 are at a distance XS, the scanning slot width, from one another. The principal separation plane 25 passes through the centers of the two boundary lines 29, 30. The optical axis 18 therefore lies precisely between the centers of the two boundary lines 29, 30. Because of this arrangement of the optical axis 18 between the boundary lines 29, 30, the field 4 is therefore a field with a minimum ring field radius R. This is given by the following expression:

$$R = SQRT\left[\left(\frac{XS}{2}\right)^2 + \left(\frac{YS}{2}\right)^2\right]$$

In the projection optical system 7 of FIG. 2, the object field 4 has dimensions of XS=104 mm (scanning slot width) and YS=8 mm (scanning slot length). This results in a ring field radius R of 52.154 mm for the object field 4.

Between the boundary lines 29, 30 and the graduated circle 28, which is shown at the top of FIG. 3, the field 4 has border transitions 31, 32, where the graduated circle 28 transitions into the boundary lines 29, 30 which extend in a straight line. Between the border transition 31, 32, a field radius vector 33 covers an azimuth angle α, which is calculated using the following formula:

$$\alpha = 2\arcsin(\tfrac{1}{2}XS/R)$$

This results in an azimuth angle α of 171.2° for the object field 4. The image field 8 has the same azimuth angle. This high azimuth angle means that the field 4 is arranged as close as possible to the optical axis 18 for a given XS extension. This facilitates an imaging error correction when imaging through the projection objective 7 between the object field 4 and the image field 8. In addition, the large azimuth angle leads to small parent diameters and to low asphericities of the mirrors M1 to M6. The parent diameter of a mirror is defined in the professional article "EUV Engineering Test Stand" by D. A. Tichenor et al., Lawrence Livermore National Laboratory, 14.02.2000, FIG. 6 (preprint UCRL-JC-137668). With the large azimuth angle, it is also possible to keep the angles of incidence on the mirrors M1 to M6 low.

Figure 4:
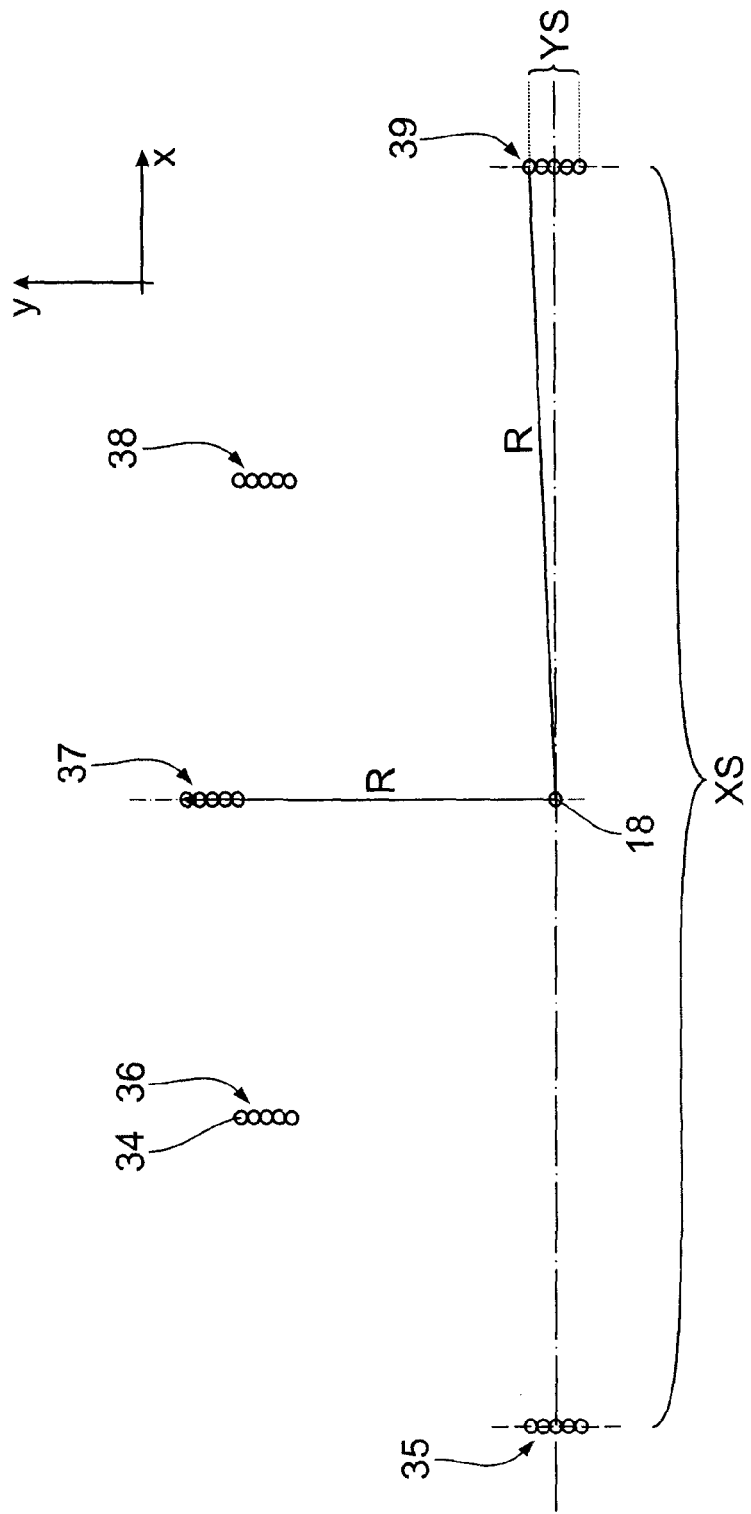
FIG. 4 is a section through imaging rays of selected field points and through an optical axis of the imaging optical system according to FIG. 2 in the region of an object plane thereof.
Figure 6:
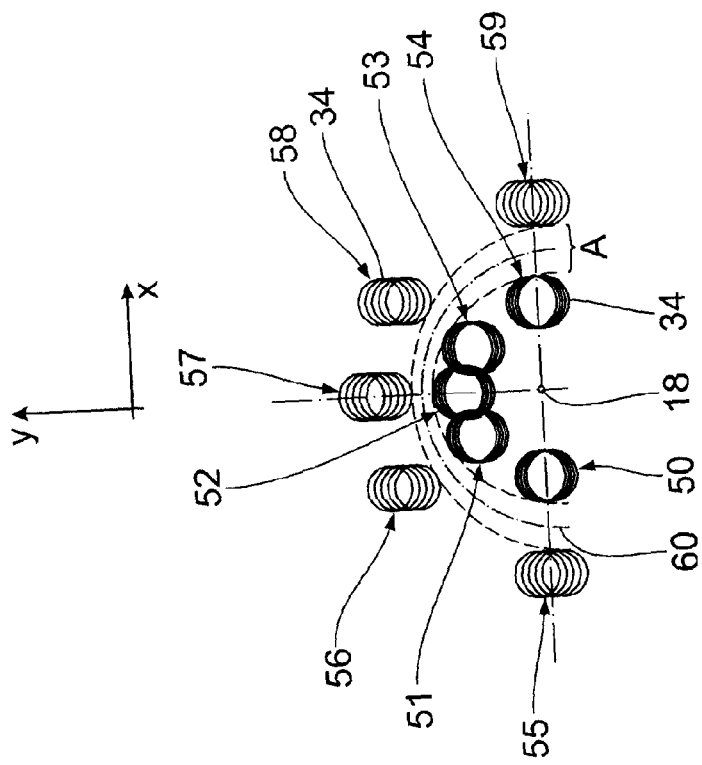
FIG. 6 is a section through the imaging rays according to FIG. 4 through a plane VI-VI in FIG. 2.
Figure 5:
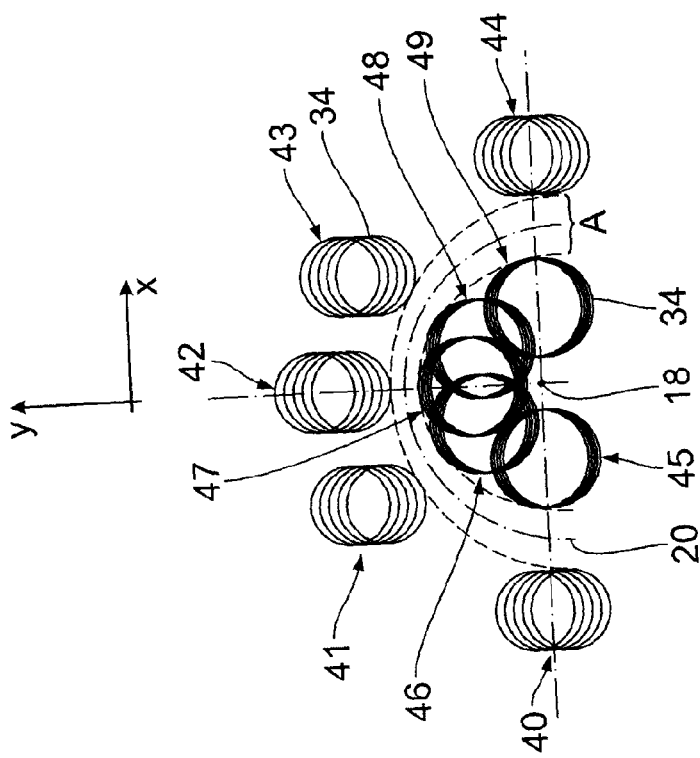
FIG. 5 is a section through the imaging rays according to FIG. 4 through a plane V-V in FIG. 2.

FIGS. 4 to 6 show the path of light beams 34 to selected object field points within the non-obscured mirror group 19. The light beams 34 of all light beam groups which are discussed in the following in connection with FIGS. 4 to 6 are each associated with the same 25 object field points. The light beams 34 of a total of five light beam groups 35, 36, 37, 38, 39 are shown. The light beams groups 35 to 39 are numbered from left to right in FIG. 4. Each light beam group 35 to 39 has five light beams 34 which belong to object field points with the same x value and are spaced equidistantly from one another in the y direction. The central light beam group 37 in FIG. 4 belongs to the object field points lying in the meridional plane.

FIG. 4 shows the light beams 34 in the vicinity of the object plane 5 in such a way that the shape of the arc-shaped object field 4 can be seen. The two light beam groups 35 and 39 at the edges proceed from object field points lying on the boundary lines 29, 30. The view of FIG. 4 is compressed in the y direction in such a way that the arc field radius R appears smaller in the y direction than in the x direction.

The field radius sector R, which belongs to the central light beam group 37, appears at the top in FIG. 4. In FIG. 4, the light beam groups 35 to 39 form a downwardly open semicircle about the optical axis 18.

FIG. 5 shows the light beams 34 in a sectional plane V of FIG. 2, i.e., in the region of the mirror M1. Light beam groups 40 to 44 reflected on the mirror M1 lie on a ring segment and form, in FIG. 5, a downwardly open external semicircle about the optical axis 18.

Furthermore, the plane V is passed through by light beam groups 45 to 49, which extend between the mirrors M2 and M3 in the light path.

The light beam groups 45 to 49 also form a semicircle, which is downwardly open in FIG. 5, about the optical axis 18. The semicircle of the light beam groups 45 to 49 thus lies between the optical axis 18 and the semicircle which is formed by the light beam groups 40 to 44.

Due to the fact that the two semicircles of the light beam groups 40 to 44 on the one hand and 45 to 49 on the other hand are each open downwardly, a sufficiently large minimal distance may be achieved between the individual light beams 34 of the light beam groups 40 to 44 on the one hand and 45 to 49 on the other hand with a compact arrangement of the light beam groups 40 to 49. This distance is denoted by A in FIG. 5. The through-opening 20 in the mirror M4 may thus be delimited between the light beam groups 40 to 44 on the one hand and 45 to 49 on the other hand without further steps being taken, as is shown in FIG. 5 by a dotted and dashed line. The distance A is necessary in practice because the mirrors M1 to M6 generally cannot be produced so as to be perfectly sharp-edged. The distance A also serves as a tolerance for assembling and adjusting the system. Conventionally, the distance A is a few millimeters.

FIG. 6 is a view similar to FIG. 5 of the light beams 34 to the 25 object field points in a plane VI, in the region of which the mirror M2 is arranged. Light beam groups 50, 51, 52, 53, 54 lie adjacent to the optical axis 18 at the place where the light beam 34 reflects on the mirror M2. The light beam groups 50 to 54 are arranged in a semicircle which is downwardly open in FIG. 6. This semicircle is surrounded by a likewise downwardly open semicircle of light beam groups 55 to 59, which pass through the plane VI between the object plane 5 and the mirror M1 in the imaging light path. Thus, the semicircle openings of the semicircles which are associated with the light beam groups 50 to 54 on the one hand and 55 to 59 on the other hand are also open in the same direction in the plane VI, in such a way that a distance A is provided between these light beam groups 50 to 54 on the one hand and 55 to 59 on the other hand with a compact arrangement at the same time. In this case too, a delimitation 60 at the edges of the mirror M2 is possible without vignetting the light beam groups 50 to 54 on the one hand and 55 to 59 on the other hand, as is indicated in dotted and dashed lines in FIG. 6.

Between the planes V and VI, the individual rays 15 thus pass through a multiple pass-through region 61 (cf. FIG. 2). This multiple pass-through region 61 is passed through a total of three times, in particular, on the one hand by individual rays 15 between the object plane 5 and the mirror M1, on the other hand by individual rays 15 between the mirrors M1 and M2, and also by individual rays 15 between the mirrors M2 and M3. There is no pupil plane of the projection optical system 7 in the multiple pass-through region 61. The pupil planes 17 and 23 are arranged outside the multiple pass-through region 61.

Figure 7:
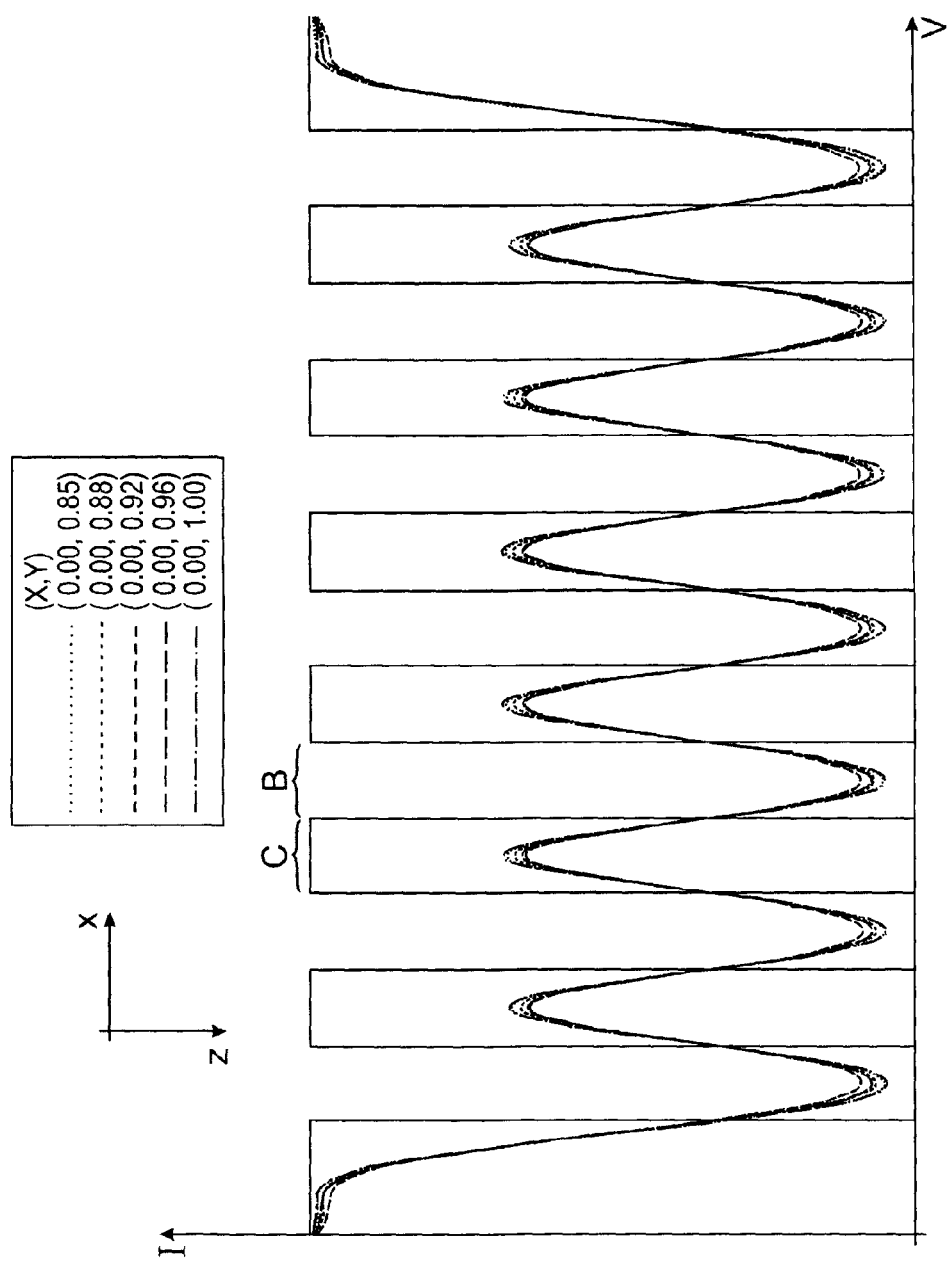
FIG. 7 shows a result of a partially coherent aerial image calculation of a structure image with the imaging optical system according to FIG. 2, in the form of a diagram which shows a relative intensity of the imaging rays as a function of a displacement in the image field of the imaging optical system.

FIG. 7 shows the result of a partially coherent aerial image calculation of the projection objective 7. A diagram is shown in which a relative intensity I is plotted upwards as a function of a position V, plotted to the right, in the image field 8. The diagram according to FIG. 7 shows the result of an imaging of a rectangular structure with a total of seven individual structures B with an image-side structure width of 10 nm and intermediate spaces C with an image-side structure distance likewise of 10 nm. The object-side structure width results from the image-side structure width via the imaging scale and in the present case is 8×10 nm=80 nm. This structure is arranged in the object field 4, i.e. on the reticle 10. The relative intensities at different y values during a scan through the image field 8 are plotted as approximately sinusoidal lines in the diagram of FIG. 7. The wavelength of the imaging light is 6.9 nm.

The relative intensities fluctuate between approximately 0.06 at the location of the 10 nm structures B and 0.62 in the centre of the 10 nm intermediate spaces C.

Due to the considerable variation in the relative intensity between the structure regions B and the structure intermediate spaces C, this 10 nm structure can be resolved in the image plane 9 without further steps being taken and can be used for the production of a corresponding structure in the image field 8 by exposure of a corresponding photoresist on the substrate 11.

Figure 8:
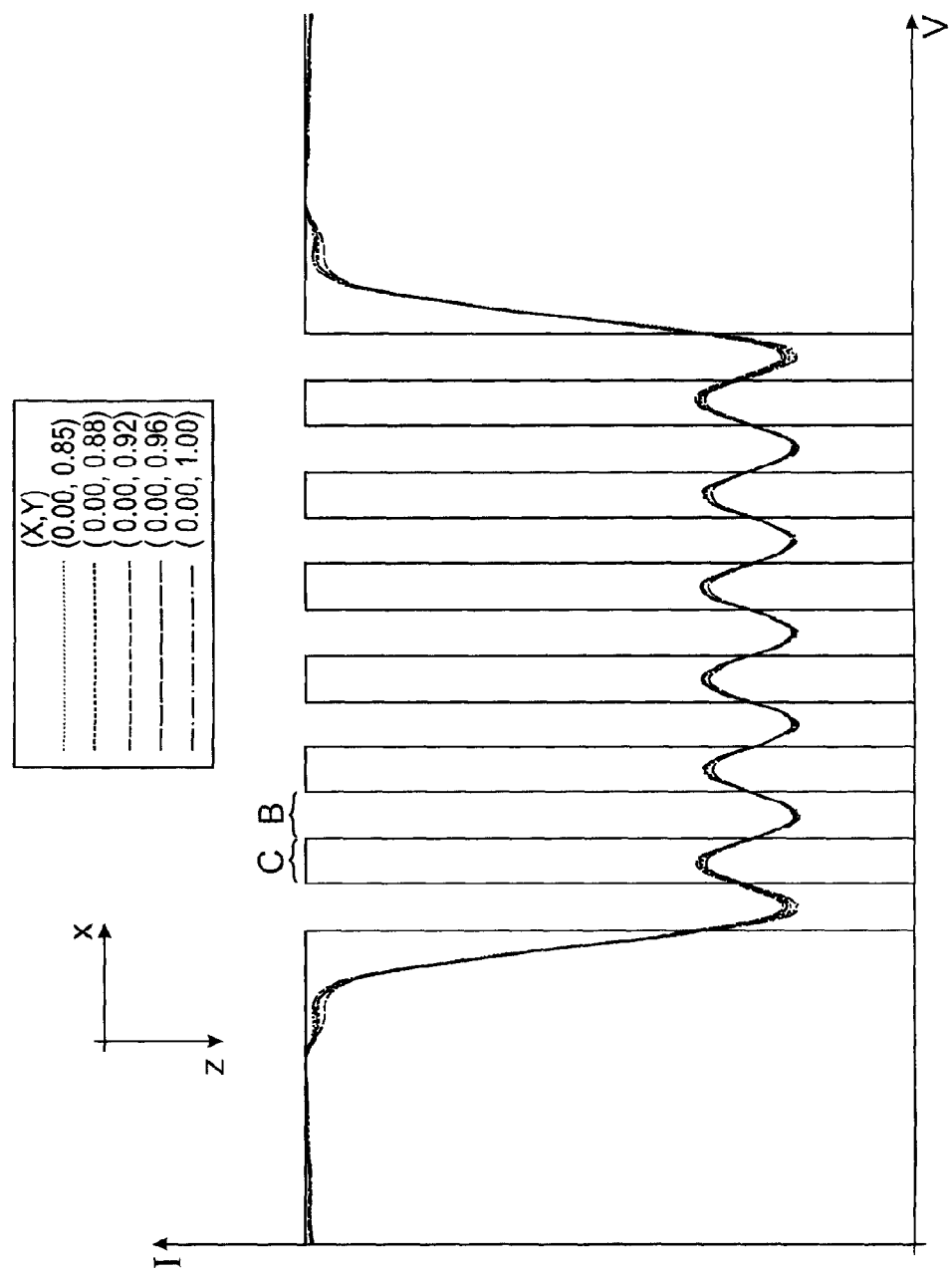
FIG. 8 is a view similar to FIG. 7 of the result of a partially coherent aerial image calculation of a structure image with a smaller structural width by comparison with FIG. 7.

FIG. 8 is a representation similar to FIG. 7 of the result of a partially coherent aerial image calculation of the projection objective 7 according to FIG. 2 in a structural resolution of structures B with structure intermediate spaces C with an extension of 6 nm in each case on the image side. A wavelength of 6.9 nm is also used in this case. In this case, the relative intensity likewise varies approximately sinusoidally from a value of approximately 0.2 in the middle of the structures B to approximately 0.37 in the centre of the intermediate space C between the structures B. Therefore, the 6 nm structures may also be imaged with sufficient intensity variation for a photoresist development.

A wavelength of 6.9 nm is also used in this case.

Figure 9:
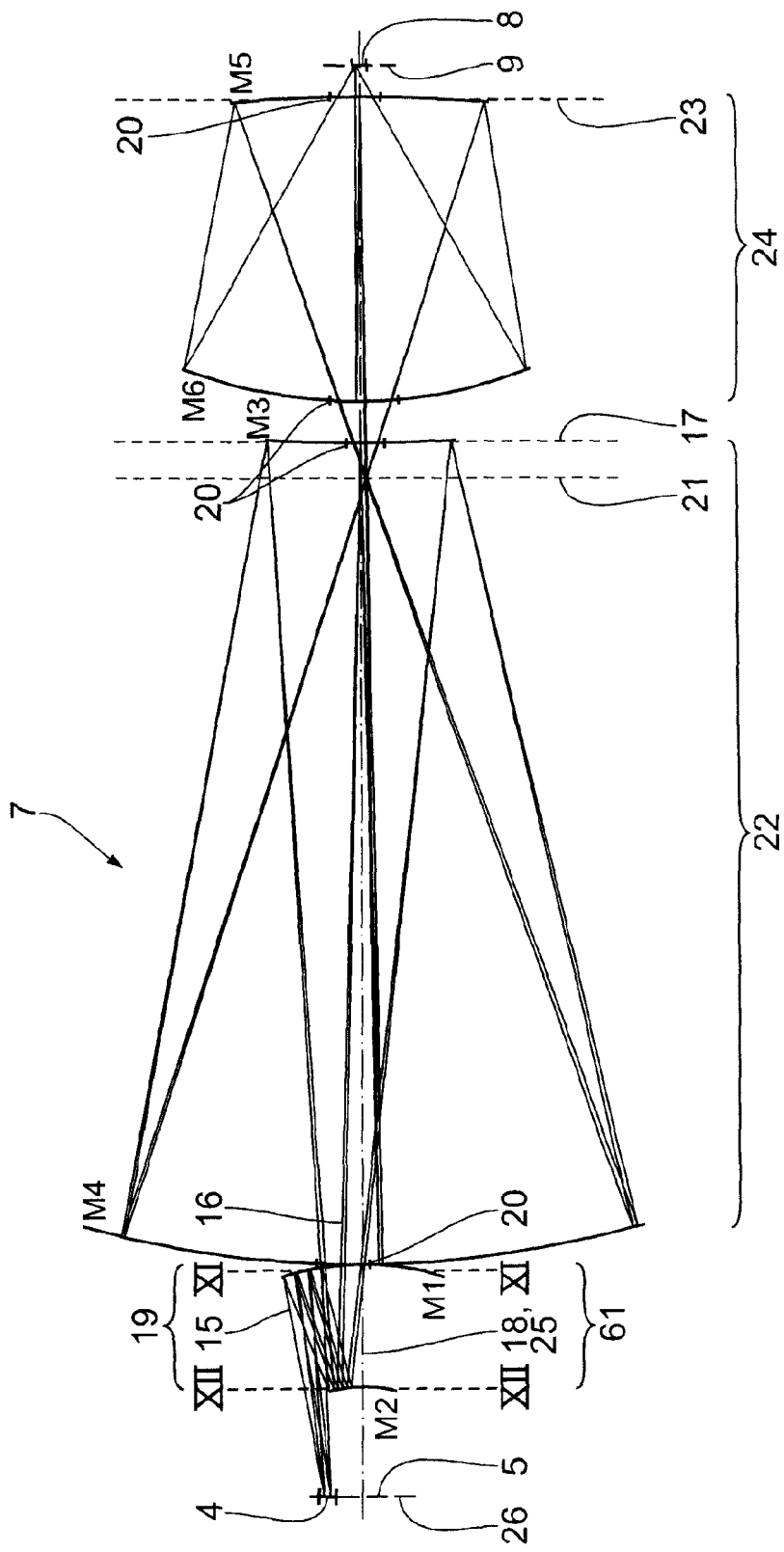
FIG. 9 is a view similar to FIG. 2 of a further embodiment of an imaging optical system for the projection exposure apparatus according to FIG. 1.

FIG. 9 shows a further embodiment of a projection optical system 7. Components and details which correspond to those which have already been explained with reference to FIGS. 1 to 8 have the same reference numerals and will not be discussed in detail again.

The optical data of the projection optical system 7 according to FIG. 9 are reproduced in the following by means of two tables which correspond in layout to the tables for the projection optical system 7 according to FIG. 2.

| Surface | Radius (1/c) | Thickness | Operating mode |
|---|---|---|---|
| Object plane | INFINITY | 320.330 | |
| M1 | −393.803 | −170.123 | REFL |
| M2 | −208.260 | 1326.985 | REFL |
| STOP | INFINITY | 0.000 | |
| M3 | 3524.853 | −1156.745 | REFL |
| M4 | 1373.092 | 1633.832 | REFL |
| M5 | −2070.870 | −417.088 | REFL |
| M6 | 729.502 | 462.810 | REFL |
| Image plane | INFINITY | 0.000 | |

| Surface | K | A | B |
|---|---|---|---|
| M1 | 0.000000E+00 | −2.256168E−10 | −1.464839E−15 |
| M2 | 0.000000E+00 | 0.000000E+00 | 0.000000E+00 |
| M3 | 0.000000E+00 | 1.686353E−09 | 1.384199E−14 |
| M4 | 0.000000E+00 | −1.141200E−12 | −1.895182E−19 |
| M5 | 0.000000E+00 | 3.648003E−10 | 9.829850E−16 |
| M6 | 0.000000E+00 | 1.500658E−10 | 5.461440E−16 |

| Surface | C | D | E |
|---|---|---|---|
| M1 | −9.891998E−20 | 4.705529E−24 | −1.095685E−28 |
| M2 | 0.000000E+00 | 0.000000E+00 | 0.000000E+00 |

-continued

| | | | |
|---|---|---|---|
| M3 | 4.803348E-20 | 6.493470E-24 | -2.340102E-29 |
| M4 | 1.242408E-24 | -7.309532E-30 | 1.625546E-35 |
| M5 | 1.150420E-20 | -2.504098E-25 | 2.419328E-30 |
| M6 | 1.394218E-21 | 6.518915E-27 | 1.785169E-32 |

The embodiment according to FIG. 9 has a numerical aperture of 0.50. The intermediate image plane 21 lies between the mirrors M4 and M5 in the light path, spatially in front of the mirror M3 and adjacent thereto. The mirror M2 is spherical. Otherwise, the construction of the projection optical system 7 according to FIG. 9 corresponds to that of the projection optical system 7 according to FIG. 2.

The following table summarizes the maximum angles of incidence for the individual rays 15 on the mirrors M1 to M6. The third column additionally shows the maximum deviation of the reflection surfaces of the mirrors M1 to M6 from a spherical surface which is fitted to the reflection surface with a minimum error (best fit sphere). The maximum deviation is 180 µm. Thus, the asphericities of all of the mirrors M1 to M6 of the projection optical system 7 according to FIG. 9 are small and the mirror M2 is actually spherical, and this simplifies the construction of the reflection surfaces thereof

| Mirror | Max. angle of incidence (meridional section) [°] | Min. angle of incidence (meridional section) [°] | Max. deviation of the surfaces from a best fit sphere [µm] |
|---|---|---|---|
| M1 | 6.95 | 4.61 | 5 |
| M2 | 11.96 | 7.45 | 0 |
| M3 | 9.75 | 0.47 | 160 |
| M4 | 3.82 | 0.81 | 6 |
| M5 | 15.34 | 2.27 | 104 |
| M6 | 10.41 | 2.20 | 180 |

The ratio of the maximum angle of incidence of imaging light on the reflection surfaces of the mirrors M1 to M6 of the projection optical system 7 according to FIG. 9, in particular the angle of incidence 15.34° on the mirror M5, and the numerical aperture of 0.5 is 30.68° in the projection optical system 7 of FIG. 9.

The total constructional length of the projection objective 7 of FIG. 9 is 2,000 mm. The maximum central pupil obscuration in the surface is less than 7 per cent.

Figure 10:
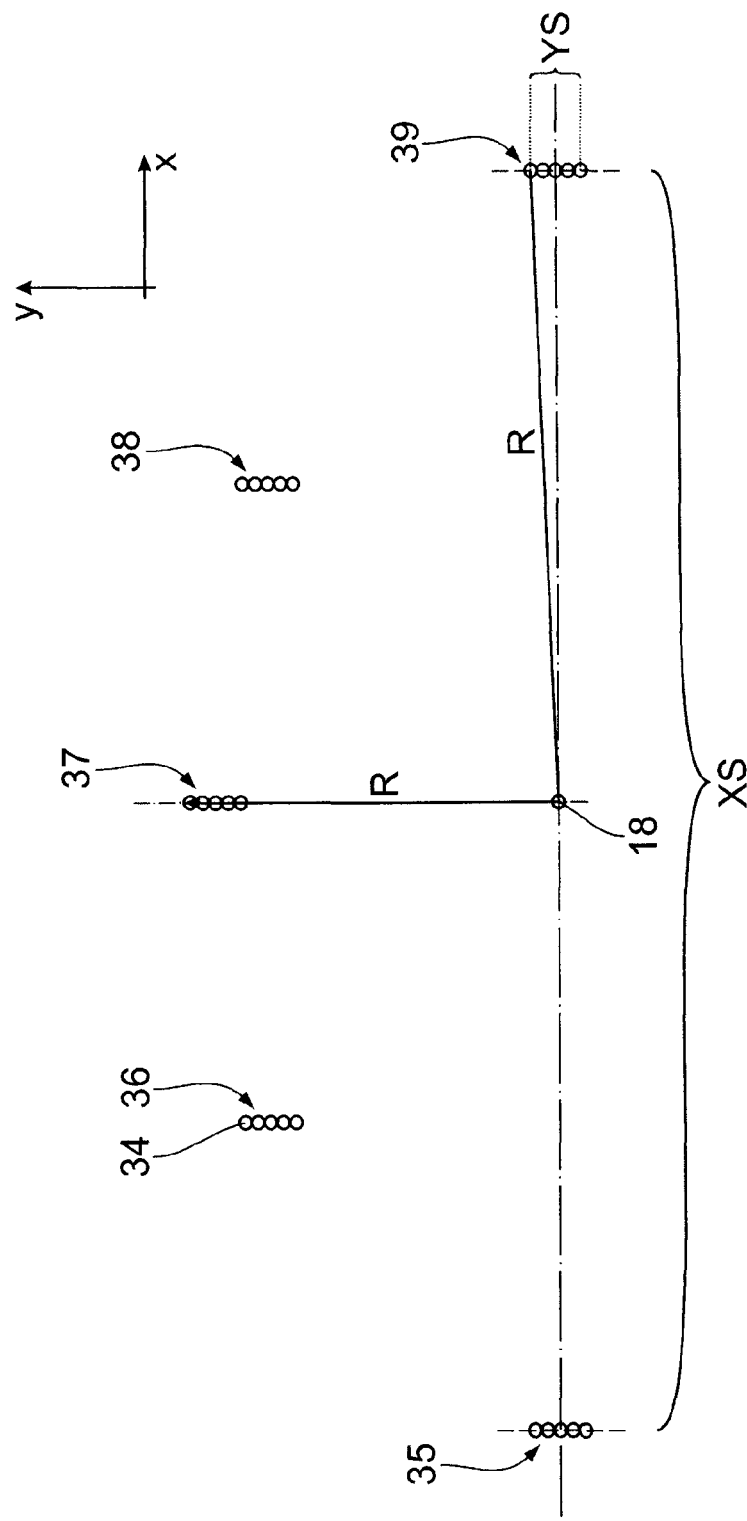
FIG. 10 is a view similar to FIG. 4 of penetration points of imaging rays of selected field points of the imaging optical system according to FIG. 9.
Figure 11:
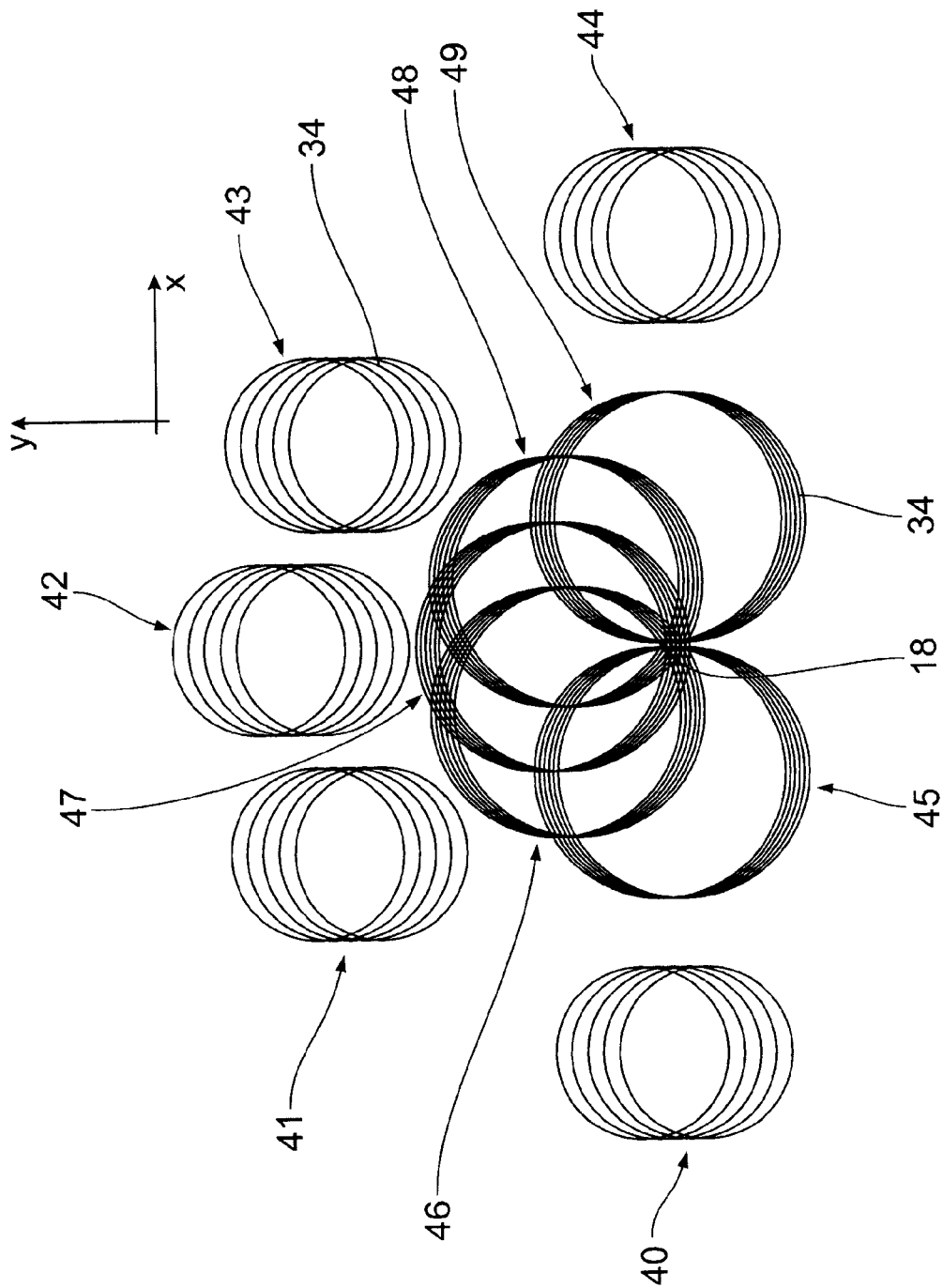
FIG. 11 is a section through the imaging rays according to FIG. 10 through a plane XI-XI in FIG. 9.
Figure 12:
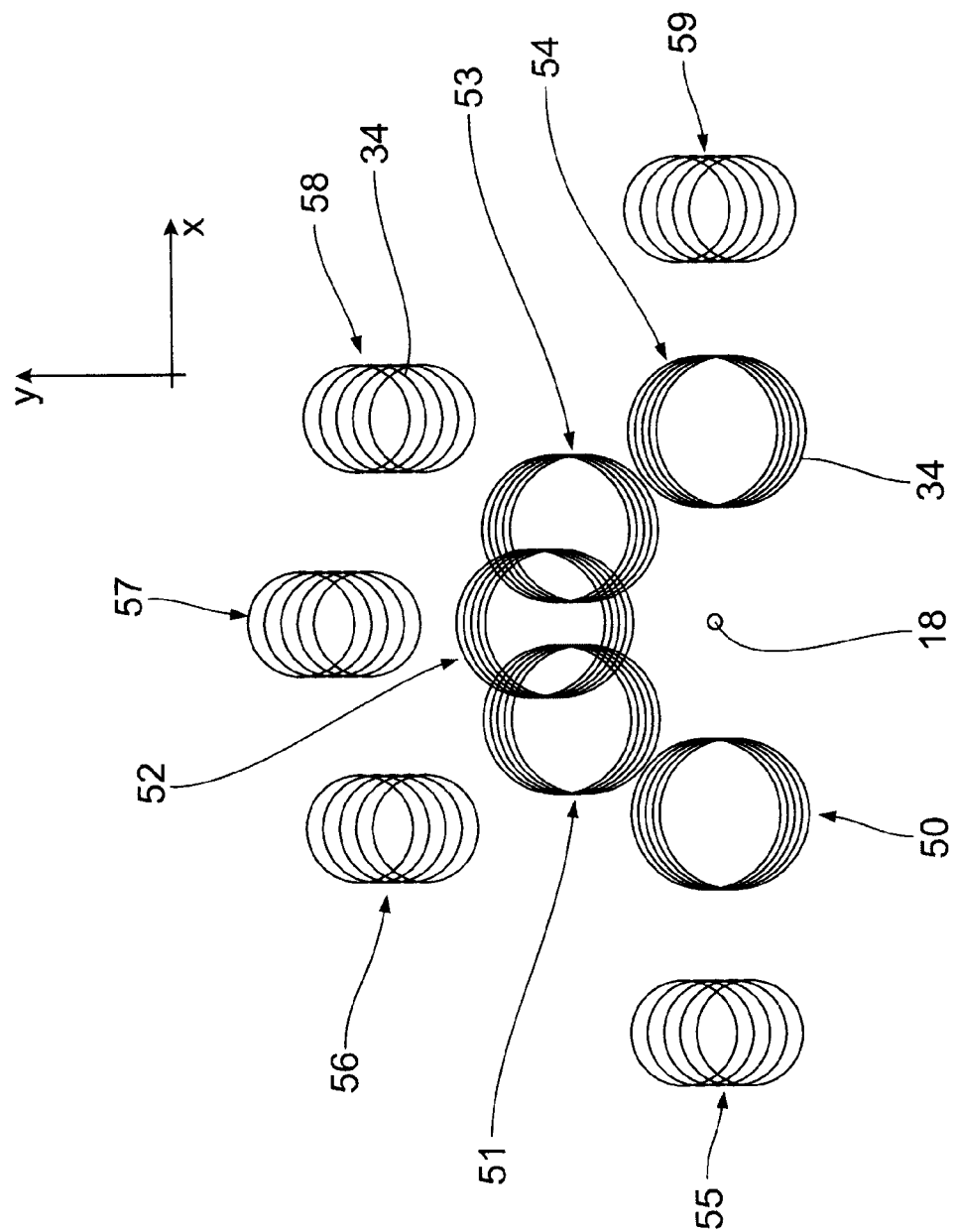
FIG. 12 is a section through the imaging rays according to FIG. 10 through a plane XII-XII in FIG. 9.

FIGS. 10 to 12 are a representation corresponding to that of FIGS. 4 to 6 of the arrangement of the light beam groups 35 to 39 in the region of the object plane 5 (FIG. 10), of the light beam groups 40 to 44 and 45 to 49 in a plane XI in the region of the mirror M1 (FIG. 11) and of the light beam groups 50 to 54 and 55 to 59 in a plane XII in the region of mirror M2 (FIG. 12). The arrangement of the light beam groups is different in the projection objectives 7 of FIG. 2 and FIG. 9 in terms of the diameters of the light beams and of the distance of the light beams from one another, but not in terms of the semicircular arrangement of the light beam groups and of the respectively identically oriented downward openings of these semicircles which are at a distance from one another.

There is no pupil plane of the projection optical system 7 in the multiple pass-through region 61 of the projection objective 7 according to FIG. 9 between the planes XI and XII, as is also the case in the projection objective 7 of FIG. 2.

In the non-obscured mirror groups, the numerical aperture is in each case considerably lower than in the obscured mirror groups.

Figure 13:
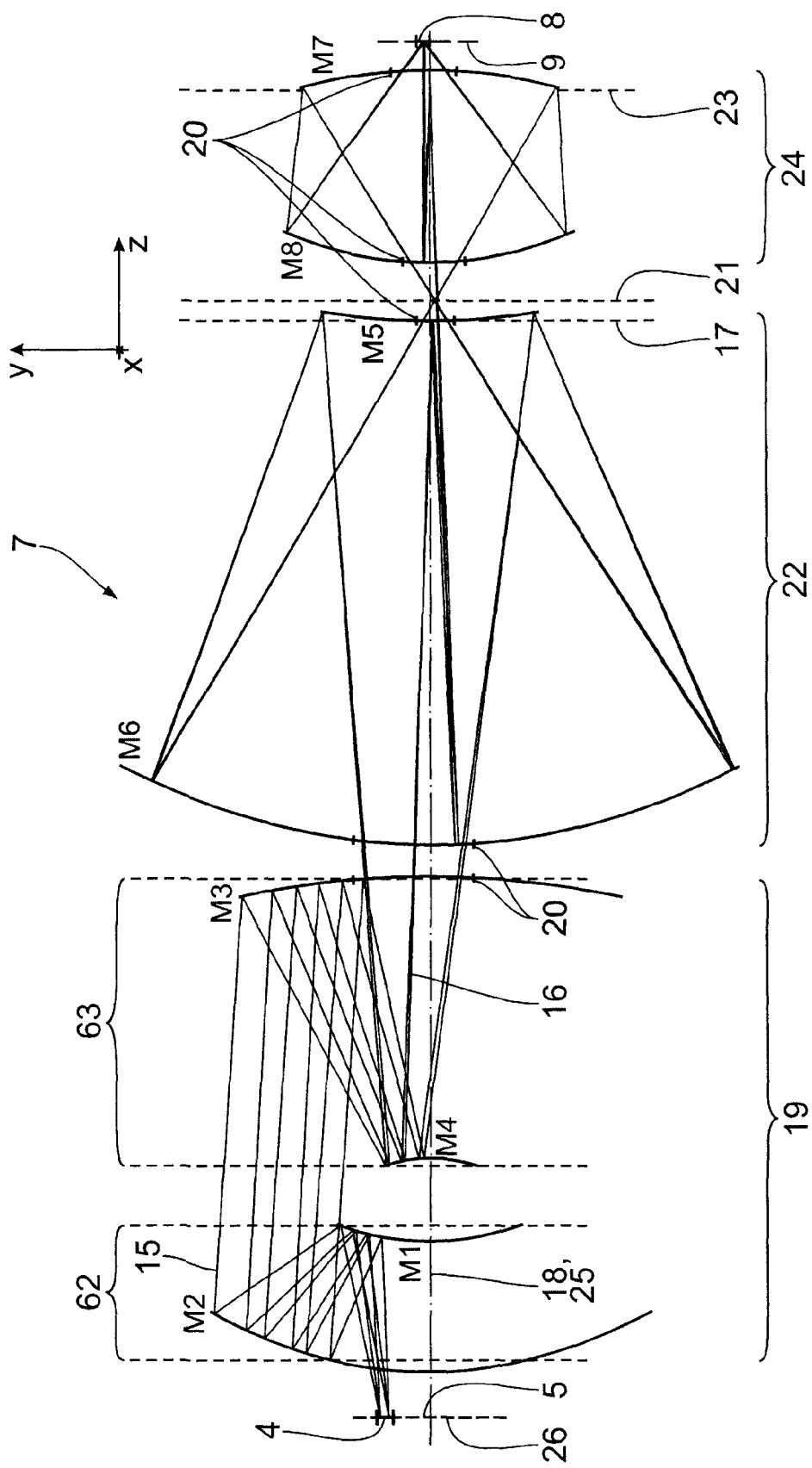
FIG. 13 is an illustration, similar to FIG. 2, of another embodiment of an imaging optical system for the projection exposure apparatus according to FIG. 1.

FIG. 13 is another embodiment of a projection optical system 7 to be installed in the projection exposure apparatus 1. Components and details which correspond to those explained above with reference to FIGS. 1 to 12 have the same reference numerals and are not discussed in detail again.

The optical data of the projection optical system 7 according to FIG. 13 are hereinafter listed in two tables whose structure corresponds to that of the tables according to FIG. 2.

| Surface | Radius (1/c) | Thickness | Operating Mode |
|---|---|---|---|
| Object plane | INFINITY | 182.885 | |
| M1 | 312.514 | -135.045 | REFL |
| M2 | 461.057 | 514.193 | REFL |
| M3 | -989.211 | -295.490 | REFL |
| M4 | -210.779 | 875.015 | REFL |
| M5 | 760.298 | -545.015 | REFL |
| M6 | 698.490 | 798.704 | REFL |
| M7 | -576.011 | -19.744 | REFL |
| DIAPHRAGM | INFINITY | -173.945 | |
| M8 | 347.848 | 224.078 | REFL |
| Image plane | INFINITY | 0.000 | |

| Surface | K | A | B |
|---|---|---|---|
| M1 | 0.000000E+00 | 2.054833E-08 | -4.009641E-13 |
| M2 | 0.000000E+00 | 3.334553E-10 | -7.634038E-15 |
| M3 | 0.000000E+00 | -5.191038E-10 | -4.805715E-16 |
| M4 | 0.000000E+00 | -8.530524E-08 | -7.872800E-12 |
| M5 | 0.000000E+00 | -9.493122E-10 | -4.519746E-14 |
| M6 | 0.000000E+00 | 1.067524E-10 | 3.344389E-16 |
| M7 | 0.000000E+00 | 3.431647E-10 | -3.006760E-15 |
| M8 | 0.000000E+00 | -5.212207E-09 | -4.936095E-14 |

| Surface | C | D | E |
|---|---|---|---|
| M1 | 7.171735E-17 | -2.913353E-21 | 1.088107E-25 |
| M2 | 1.024823E-19 | -9.460244E-25 | 3.872599E-30 |
| M3 | 1.117253E-19 | -1.418804E-24 | 9.313360E-30 |
| M4 | -8.643400E-16 | -1.810090E-20 | -3.582650E-23 |
| M5 | 2.842871E-19 | -9.298310E-24 | -1.362975E-28 |
| M6 | 8.381905E-22 | 2.378219E-27 | 2.644241E-33 |
| M7 | 1.681919E-19 | -1.186133E-24 | 2.512989E-29 |
| M8 | 3.981107E-19 | 3.278180E-24 | -3.575793E-29 |

| Surface | F | G |
|---|---|---|
| M1 | 0.000000E+00 | 0.000000E+00 |
| M2 | 0.000000E+00 | 0.000000E+00 |
| M3 | 0.000000E+00 | 0.000000E+00 |
| M4 | 0.000000E+00 | 0.000000E+00 |
| M5 | 0.000000E+00 | 0.000000E+00 |
| M6 | 3.062582E-38 | 0.000000E+00 |
| M7 | 0.000000E+00 | 0.000000E+00 |
| M8 | 0.000000E+00 | 0.000000E+00 |

The constants K and A to G indicated in the second table are to be used in the following equation for the sagittal height in order to describe the precise surface shape of the reflection surfaces of the mirrors M1 to M8:

$$z(h) == \frac{ch^2}{1 + SQRT\{1 - (1 + K)c^2 h^2\}} ++ Ah^4 + Bh^6 + Ch^8 + Dh^{10} + Eh^{12} + Fh^{14} + Gh^{16}$$

The projection optical system 7 according to FIG. 13 has a total of 8 mirrors which are numbered M1 to M8 in the sequence of the light path, starting from the object field 4. FIG. 13 shows merely the calculated reflection surfaces of the mirrors M1 to M8.

The mirrors M1, M4 and M5 are convex mirrors. The mirrors M2, M3 and M6 to M8 are concave mirrors. The reflection surfaces of the mirrors M1 and M2 face each other.

The reflection surfaces of the mirrors M2 and M3 face each other. The reflection surfaces of the mirrors M1 and M4 are arranged back-to-back. The reflection surfaces of the mirrors M4 and M5 as well as the reflection surfaces of the mirrors M7 and M8 face each other. The reflection surfaces of the mirrors M5 and M8 are arranged back-to-back.

The mirrors M1 to M4 form the first non-obscured mirror group 19 of the projection optical system 7 according to FIG. 13. The mirrors M1 to M4 are used in the shape of a ring segment and off-axis in relation to the optical axis 18.

In this embodiment, the ring segments of the used reflection surfaces of the mirrors M1 to M4 are also semicircular, wherein the semicircles are open when projected downwardly onto the xy-plane, in other words in the direction of negative y-values.

In the non-obscured mirror group 19 of the projection optical system 7 according to FIG. 13, the imaging rays extending in the meridional section do not pass through the principal separation plane 25.

In the projection optical system 7 according to FIG. 13, multiple pass-through regions 62, 63 are disposed between the mirrors M1 and M2 on the one hand and the mirrors M3 and M4 on the other hand, which multiple pass-through regions 62, 63 are delimited by planes which are indicated by dashed lines in FIG. 13 and extend parallel to the object plane 5 and the image plane 9 such as the planes V and VI in FIG. 2. The multiple pass-through regions 62, 63 are in each case passed through three times by the imaging rays. In the multiple pass-through region 62, the individual rays 15 extend on the one hand between the object field 4 and the mirror M1 and on the other hand between the mirror M1 and the mirror M2 as well as between the mirrors M2 and M3. In the multiple pass-through region 63, the individual rays 15 extend on the one hand in the light path between the mirrors M2 and M3 and on the other hand between the mirrors M3 and M4 as well as between the mirrors M4 and M5.

There is no pupil plane of the projection optical system 7 according to FIG. 13 in the multiple pass-through regions 62, 63.

Likewise, in the projection optical system 7 according to FIG. 13, the object field 4 and the image field 8 have the shape described in relation to the description of FIG. 3 and the same dimensions XS and YS. Correspondingly, the fields 4, 8 also have an azimuth angle $\alpha$ of 171.2°.

In the projection optical system 7 according to FIG. 13, a first pupil plane 17 lies in the region of the reflection of the individual rays 15 on the mirror M5.

The mirrors M5 to M8 are obscured and have in each case a substantially central through-opening 20.

The mirrors M5 to M8 form two obscured mirror groups 22, 24 corresponding to the arrangement of the obscured mirrors M3 to M6 in the projection optical system 7 according to FIG. 2.

Like in the projection optical system 7 according to FIG. 2, the intermediate image plane 21 of the projection optical system 7 according to FIG. 13 lies between the obscured mirror groups 22 and 24.

The second pupil plane 23 as well as the aperture diaphragm are disposed near the reflection of the individual rays 15 on the mirror M7.

The projection optical system 7 according to FIG. 13 has a numerical aperture of 0.60.

Figure 14:
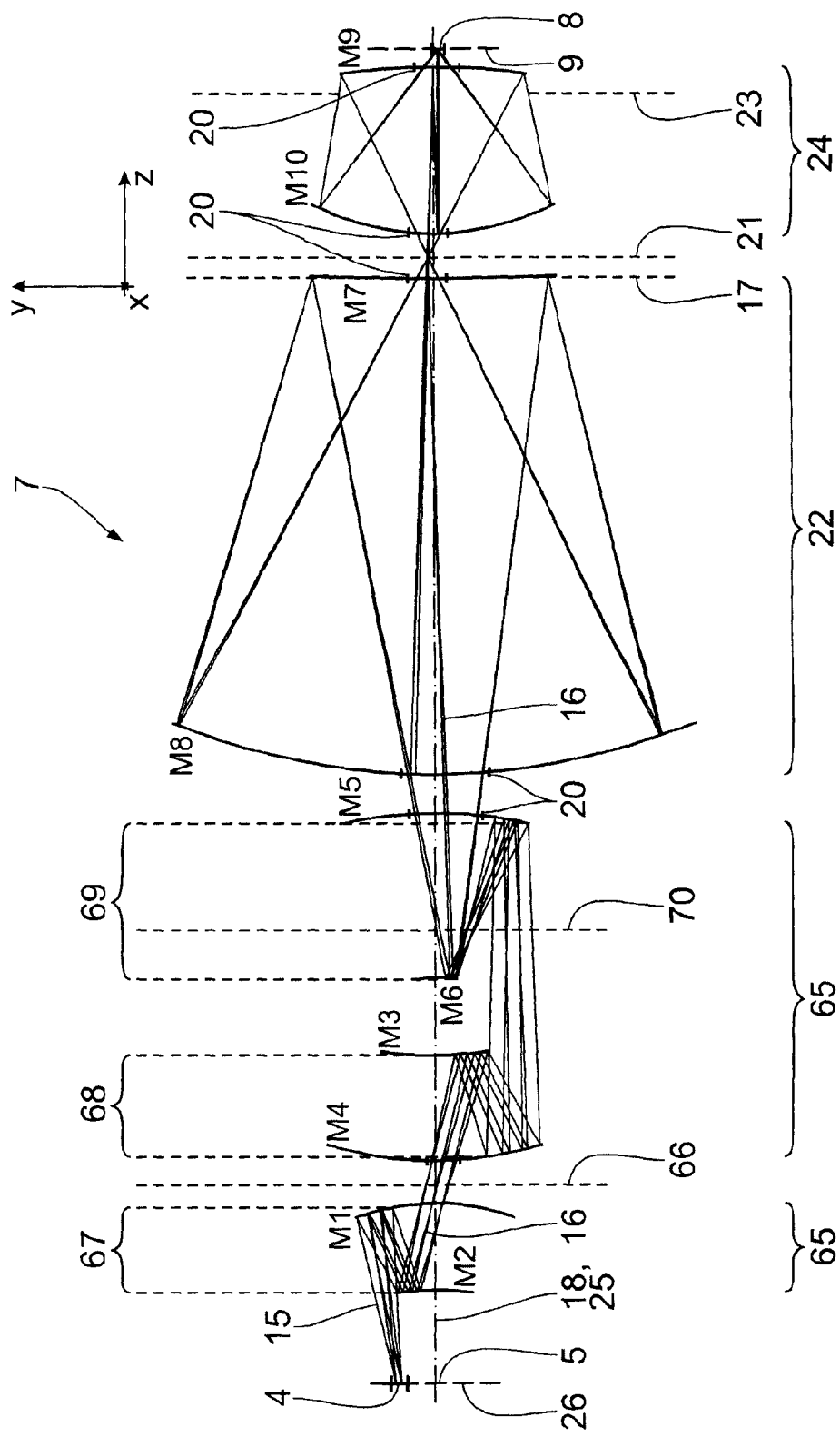
FIG. 14 is an illustration, similar to FIG. 2, of another embodiment of an imaging optical system for the projection exposure apparatus according to FIG. 1.

FIG. 14 shows another embodiment of a projection optical system 7 to be used in the projection apparatus 1. Components and details which correspond to those explained above with reference to FIGS. 1 to 13 have the same reference numerals and are not discussed in detail again.

The optical data of the projection optical system 7 according to FIG. 13 are hereinafter listed in two tables whose structure corresponds to those of the tables according to FIG. 2.

| Surface | Radius (1/c) | Thickness | Operating Mode |
|---|---|---|---|
| Object plane | INFINITY | 234.636 | |
| M1 | −287.951 | −113.003 | REFL |
| M2 | −377.077 | 307.165 | REFL |
| M3 | 448.125 | −138.650 | REFL |
| M4 | 454.548 | 458.111 | REFL |
| M5 | −589.208 | −216.430 | REFL |
| M6 | −137.413 | 922.448 | REFL |
| M7 | 3248.369 | −656.018 | REFL |
| M8 | 905.405 | 930.393 | REFL |
| M9 | −786.842 | −34.144 | REFL |
| DIAPHRAGM | INFINITY | −180.231 | |
| M10 | 360.479 | 239.376 | REFL |
| Image plane | INFINITY | 0.000 | |

| Surface | K | A | B |
|---|---|---|---|
| M1 | 0.000000E+00 | −3.635133E−10 | −1.272934E−13 |
| M2 | 0.000000E+00 | 8.009620E−09 | 8.547440E−13 |
| M3 | 0.000000E+00 | −3.301069E−08 | −3.864784E−13 |
| M4 | 0.000000E+00 | −2.379284E−09 | −3.474204E−14 |
| M5 | 0.000000E+00 | −5.239687E−10 | −3.534045E−14 |
| M6 | 0.000000E+00 | −1.393622E−07 | −2.668110E−10 |
| M7 | 0.000000E+00 | 3.133269E−10 | −3.363547E−15 |
| M8 | 0.000000E+00 | 5.440423E−11 | 6.900621E−17 |
| M9 | 0.000000E+00 | 1.926841E−09 | 2.339942E−15 |
| M10 | 0.000000E+00 | −1.807405E−09 | −9.306119E−15 |

| Surface | C | D | E |
|---|---|---|---|
| M1 | 1.155813E−17 | −4.826930E−22 | 7.023739E−27 |
| M2 | 4.549328E−17 | 4.305677E−21 | 4.669221E−25 |
| M3 | 8.526965E−17 | −7.012381E−21 | 2.933090E−25 |
| M4 | −1.300936E−19 | −5.982917E−24 | −5.370645E−29 |
| M5 | 9.162259E−19 | −1.999188E−23 | 2.164273E−28 |
| M6 | 2.736516E−13 | −1.401026E−16 | 1.113816E−20 |
| M7 | −1.123687E−20 | −5.146768E−25 | 1.194508E−30 |
| M8 | 9.097747E−23 | 6.493834E−29 | 4.098093E−34 |
| M9 | 2.254061E−19 | −2.921628E−24 | 4.530106E−29 |
| M10 | 5.958825E−20 | −3.478398E−25 | 7.219935E−30 |

The sagittal height equation used to describe the precise surface shape of the reflection surfaces of the mirrors M1 to M10 corresponds to that indicated above in relation to the projection optical system 7 according to FIG. 2.

The projection optical system 7 according to FIG. 14 comprises a total of 10 mirrors which are numbered M1 to M10 in the sequence of the light path, starting from the object field 4. FIG. 14 shows the calculated reflection surfaces of the mirrors M1 to M10.

The mirrors M1, M4, M5 and M8 to M10 are concave mirrors. The mirrors M2, M3, M6, and M7 are convex mirrors.

The reflection surfaces of the mirrors M1 and M2 face each other. The reflection surfaces of the mirrors M2 and M3 face each other. The reflection surfaces of the mirrors M1 and M4 are arranged back-to-back. The reflection surfaces of the mirrors M3 and M4 as well as the reflection surfaces of the mirrors M5 and M6 face each other. The reflection surfaces of the mirrors M3 and M6 are arranged back-to-back. The reflection surfaces of the mirrors M7 and M8 as well as the reflection surfaces of the mirrors M9 and M10 face each other. The reflection surfaces of the mirrors M5 and M8 as well as the reflection surfaces of the mirrors M7 and M10 are arranged back-to-back.

The mirrors M1 to M6 are used in the shape of a ring segment and off-axis in relation to the optical axis 18. In analogy to the above description in relation to the projection optical system 7 according to FIG. 2, these ring-segment shaped reflection regions of the mirrors M1 and M2 are semi-circular, wherein the semicircles of FIG. 14 open downwardly in other words in the direction of negative y-values.

Likewise, the mirrors M3 to M6 are provided with semi-circular reflection surfaces as well which, however, open in the opposite direction, in other words towards positive y-values.

The mirrors M1 and M2 form a first non-obscured mirror group 64 of the projection optical system 7 according to FIG. 14. The mirrors M3 to M6 form a second non-obscured mirror group 65 of the projection optical system 7 according to FIG. 14. A first pupil plane 66 of the projection optical system 7 according to FIG. 14 is spatially arranged between the two mirror groups 64 and 65, namely between the two mirrors M1 and M4 which are arranged back to back with respect to their reflection surfaces.

As the pupil plane 66 is arranged between the mirror groups 64 and 65, none of the individual rays 15 penetrates the principal separation plane 25 in the meridional plane when passing through the individual mirror groups 64, 65. This principal separation plane 25 is merely penetrated by the principal rays 16 between the non-obscured mirror groups 64, 65 but not, however, in the non-obscured mirror groups 64, 65. Outside the pupil planes, the principal rays 16 do not pass through the principal separation plane 25 in the non-obscured mirror groups 64, 65.

In the projection optical system 7 according to FIG. 14, a total of three multiple pass-through regions 67, 68 and 69 are present between the mirrors M1 and M2, between the mirrors M3 and M4 as well as between the mirrors M5 and M6. These multiple pass-through regions 67 to 69 are in each case delimited by planes which are arranged parallel to the object plane 4 and to the image plane 9 and are indicated by dashed lines in FIG. 14. The individual rays 15 in each case penetrate the multiple pass-through regions 67 to 69 three times, corresponding to the above description in relation to the multiple pass-through regions 61 to 63 of the embodiments according to FIGS. 2 and 13.

No pupil plane of the projection optical system 7 is arranged in the multiple pass-through regions 67 to 69.

Groups of ray bundles in the shape of in each case two semicircles opening in the same direction pass through the two boundary planes of the multiple pass-through regions 67 to 69 several times, as explained above in relation to the projection optical system 7 according to FIG. 2. Correspondingly, the requirements to a vignetting-free configuration of the edge-side boundaries of the mirrors M1, M2, M3, M4, M5 and M6 are relaxed.

The shape and size of the object field 4 and the image field 8 of the projection optical system 7 according to FIG. 14 are equal to those of the embodiments described above.

Likewise, the fields 4, 8 of the projection optical system 7 according to FIG. 14 therefore have an azimuth angle α of 171.2°.

In the projection optical system 7 according to FIG. 14, a first intermediate image plane 70 is arranged in the light path between the mirrors M5 and M6.

The arrangement of the mirrors M7 to M10 of the projection optical system 7 according to FIG. 14 corresponds to that of the mirrors M5 to M8 of the projection optical system 7 according to FIG. 13. The mirrors M7 to M10 are obscured and have in each case a substantially central through-opening 20.

The projection optical system 7 according to FIG. 14 has a numerical aperture of 0.60.

Figure 15:
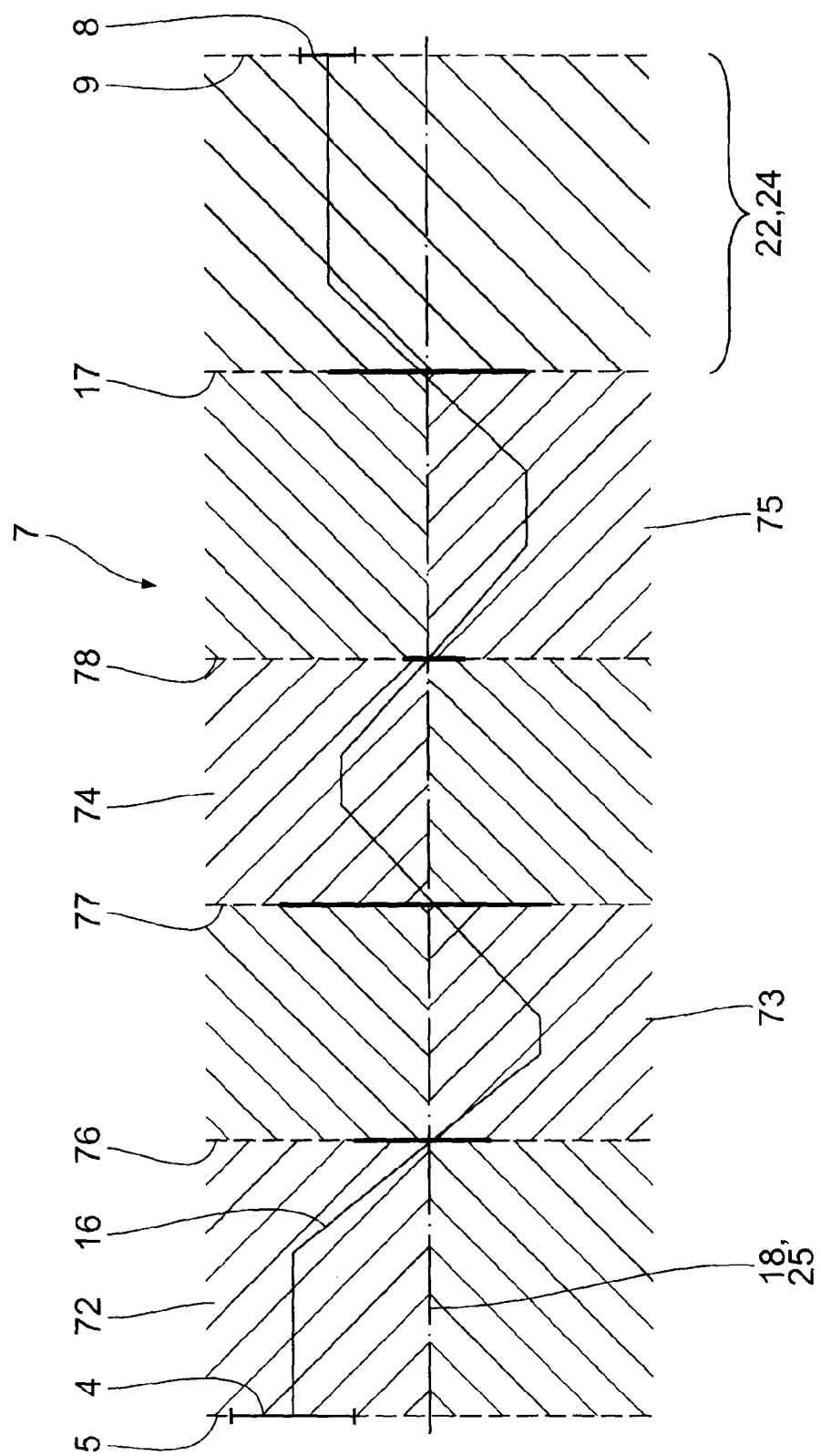
FIGS. 15 and 16 are schematized imaging light paths through an imaging optical system which, compared to the embodiments shown above, are expanded by further mirror groups which are non-obscured on the object side.
Figure 16:
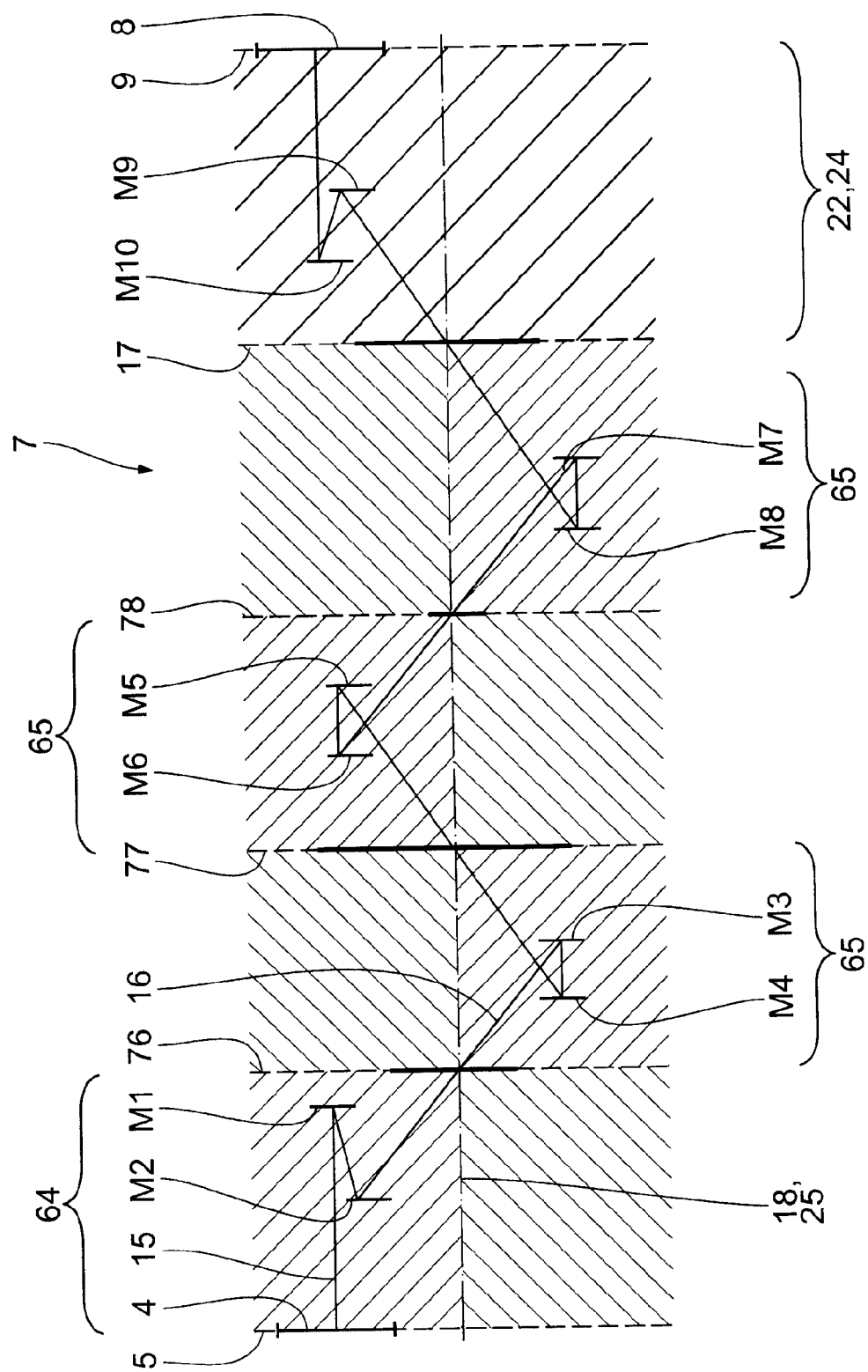

FIGS. 15 and 16 are a schematic illustration of the principal rays 16 passing through projection optical systems 7 which are an expansion to the projection optical systems 7 according to the embodiments of the FIGS. 2, 13 and 14 described above. Components and details which correspond to those explained above in relation to FIGS. 1 to 14 have the same reference numerals and are not discussed in detail again.

In contrast to the projection optical system 7 according to FIG. 14, the projection optical system 7 according to FIGS. 15 and 16 does not have two non-obscured mirror groups but a total of four non-obscured mirror groups 72, 73, 74, 75. The illustrations according to FIGS. 15 and 16 are different in that the illustration according to FIG. 16 additionally indicates folded light paths in the non-obscured mirror groups 72 to 75 as well as between the last pupil plane 17 and the image plane 9.

The first non-obscured mirror group 72 lies between the object plane 5 and a first pupil plane 76. The second non-obscured mirror groups 73 lies between the first pupil plane 76 and a second pupil plane 77. The third non-obscured pupil plane 74 lies between the sec- and pupil plane 77 and a third pupil plane 78. The fourth non-obscured pupil plane 75 lies between the third pupil plane 78 and the pupil plane 17 at the transition to the obscured mirror groups 22, 24 which are indicated as a single obscured mirror group in the schematic illustration of the FIGS. 15 and 16. The non-obscured mirror groups 72 and 75 of the schematic illustrations according to FIGS. 15 and 16 correspond to the non-obscured mirror groups 64 and 65 of the embodiment according to FIG. 14. The schematic illustrations according to FIGS. 15 and 16 may therefore be understood as an expansion of the embodiment according to FIG. 14 by two further non-obscured mirror groups, namely the mirror groups 73 and 74.

FIGS. 15 and 16 show that the principal separation plane 25 is in each case only penetrated between the non-obscured mirror groups 72 to 75 as well as in the light path behind the pupil plane 17 in the high-aperture region of the projection optical system 7, in other words in the region of the obscured mirror groups 22, 24. In the non-obscured mirror groups 72 to 75, the principal rays 16 remain in each case on one side of the principal separation plane 25. This results in the effect described above, namely that in multiple pass-through regions of the non-obscured mirror groups 72 to 75, there are groups of ray bundles 35 in which the opening of the bundle path, which is arc-shaped in the direction perpendicular to the optical axis, is in each case oriented in only one direction.

In order to produce a microstructured or nanostructured component, the projection exposure apparatus 1 is used as follows: the reflection mask 10 or the reticle, respectively, and the substrate or the wafer 11, respectively, are provided in a first step. Afterwards, a structure on the reticle, such as the structure B, C, is projected onto a light-sensitive layer of the wafer 11 by means of the projection exposure apparatus. The light-sensitive layer is then developed to create a microstructure or a nanostructure on the wafer 11 so as to obtain the microstructured component.

Other embodiments are in the following claims.

What is claimed is:

1. An imaging optical system which during operation directs light along a path to image an object field in an object plane to an image field in an image plane, the imaging optical system comprising:
a plurality of mirrors arranged to direct the light along the path, the plurality of mirrors including first and second mirrors each having a surface in the path that reflects the light but does not surround an opening for passage of the light, wherein:

the first mirror is closer to the object plane along the optical axis than any other mirror in the imaging optical system which has a surface in the path that reflects the light but does not surround an opening for passage of the light;

the second mirror is closer to the image plane along the optical axis than any other mirror in the imaging optical system which has a surface in the path that reflects the light but does not surround an opening for passage of the light;

the imaging optical system has a region having a first end which contacts the first mirror and a second end which contacts the second mirror;

the region includes two spaced-apart planes parallel to the image plane and/or the object plane;

one of the two spaced-apart planes contacts the first end of the region and the other of the spaced-apart planes contacts the second end of the region;

between the two spaced-apart planes, the imaging optical system includes at least one sub-region where the path passes multiple times;

the imaging optical system comprises at least one pupil plane;

each plane which is parallel to and between the two spaced-apart planes and where the path passes through multiple times is not in a pupil plane of the imaging optical system; and neither of the first and second mirrors is in a pupil plane of the imaging optical system.

2. The imaging optical system of claim 1, wherein the object field has the shape of an arc which is delimited by two circular arcs with the same radius which are displaced parallel to each and two straight lines respectively connecting two ends of the circular arcs, where each circular arc subtends an angle greater than 75°.

3. The imaging optical system of claim 1, wherein the plurality of mirrors comprise multiple groups of mirrors, each of which is formed only of mirrors that each have a surface in the path that reflects the light but does not surround an opening for passage of the light and the imaging optical system includes a pupil plane in the path between adjacent groups of mirrors.

4. The imaging optical system of claim 1, wherein at least one of the mirrors includes an opening for passage of the light where the opening obscures a portion of a pupil of the imaging optical system.

5. The imaging optical system of claim 1, wherein the imaging optical system includes exactly six mirrors of which at least three mirrors include an opening for the passage of the light.

6. The imaging optical system of claim 1, wherein the imaging optical system includes exactly eight mirrors of which at least three mirrors include an opening for the passage of the light.

7. The imaging optical system of claim 1, wherein the imaging optical system includes exactly eight mirrors of which exactly four mirrors include an opening for the passage of the light.

8. The imaging optical system of claim 1, wherein the imaging optical system includes exactly ten mirrors of which at least three mirrors include an opening for the passage of the light.

9. The imaging optical system of claim 1, wherein the imaging optical system includes exactly ten mirrors of which exactly four mirrors include an opening for the passage of the light.

10. A microlithographic projection exposure apparatus comprising:

a light source;

the imaging optical system of claim 1; and an illumination optical system which during operation of the microlithographic projection exposure apparatus guides light from the light source to the object field of the imaging optical system.

11. The projection exposure apparatus of claim 10, wherein the light source is configured to provide light with a wavelength of between 5 nm and 30 nm.

12. A method for the production of a microstructured component, the method comprising:

providing a reticle and a wafer;

projecting a structure on the reticle onto a light-sensitive layer on the wafer using a projection exposure apparatus; and producing a microstructure on the wafer, wherein the projection exposure apparatus comprises:

a light source configured to provide light with a wavelength between 5 nm and 30 nm;

the imaging optical system of claim 1; and an illumination optical system which during operation of the microlithographic projection exposure apparatus guides light from the light source to the object field of the imaging optical system.

13. The imaging optical system of claim 1, wherein:

the plurality of mirrors comprises a first group of mirrors, the mirrors forming the first group each have a surface in the path that reflects the light but does not surround an opening for passage of the light;

the first group is positioned along the optical axis either between the object plane and a first pupil plane in the path or between the first pupil plane and a second pupil plane in the path; and the first group comprises all mirrors between the object plane and a first pupil plane in the path or between the first pupil plane and a second pupil plane in the path.

14. The imaging optical system of claim 13, wherein a principal ray of the path which proceeds from a central point in the object field and passes through the center of pupils in respective pupil planes of the imaging optical system, proceeds in a meridional section that includes the central point between the mirrors in the first group such that it does not penetrate a plane defined by the optical axis and a line orthogonal to the meridional section.

15. The imaging optical system of claim 14, wherein:

the first group comprises two mirrors, where:

one mirror comprises a first plane parallel to the image plane and/or object plane and is closest to the object plane along the optical axis than any other mirror in the first group; and the other mirror comprises a second plane parallel to the image plane and/or object plane and is closest to the image plane along the optical axis than any other mirror in the first group;

the path passes multiple times between the first plane and the second plane; and in the meridional section, the path does not intersect the optical axis between the first plane and the second plane.

16. The imaging optical system of claim 14, wherein the object field is an arcuate-shaped field that subtends an angle which is greater than 75°.

17. The imaging optical system of claim 13, wherein at least one of the mirrors in the imaging optical system includes an opening for passing the light that causes an obscuration in a pupil of the imaging optical system.

18. The imaging optical system of claim 13, wherein the object field and the image field are displaced from the optical axis.

19. The imaging optical system of claim 13, wherein the surface of each mirror forming the first group which reflects the light is not in a pupil plane.

20. The imaging optical system of claim 1, wherein the at least one sub-region is only one sub-region.

21. The imaging optical system of claim 1, wherein the at least one sub-region comprises a plurality of sub-regions.

22. An imaging optical system which during operation directs light along a path to image an object field in an object plane to an image field in an image plane, the imaging optical system comprising:
- a plurality of mirrors arranged to direct the light along the path,
- wherein the object field has the shape of an arc which is delimited by two circular arcs with the same radius which are displaced parallel to each and two straight lines respectively connecting two ends of the circular arcs, where each circular arc subtends an angle ($\alpha$) greater than 130° and the imaging optical system is a catoptric imaging optical system.

23. The imaging optical system of claim 22, wherein the imaging optical system comprising:
- at least four mirrors arranged to direct the light along the path, including at least two mirrors each having a surface in the path that reflects the light but does not contain an opening for passage of the light,
- wherein one of the mirrors that does not contain an opening is a spherical mirror.

24. An imaging optical system which during operation directs light along a path to image an object field in an object plane to an image field in an image plane, the imaging optical system comprising:
- a plurality of mirrors arranged to direct the light along the path, the plurality of mirrors including a first and second mirrors each having a surface in the path that reflects the light but does not surround an opening for passage of the light wherein:
- the first mirror is closer to the object plane along the optical axis than any other mirror in the imaging optical system which has a surface in the path that reflects the light but does not surround an opening for passage of the light;
- the second mirror is closer to the image plane along the optical axis than any other mirror in the imaging optical system which has a surface in the path that reflects the light but does not surround an opening for passage of the light;
- the imaging optical system has a region having a first end which contacts the first mirror and a second end which contacts the second mirror;
- the region includes two spaced-apart planes parallel to the image plane and/or the object plane;
- one of the two spaced-apart planes contacts the first end of the region and the other of the spaced-apart planes contacts the second end of the region;
- at each of the spaced-apart planes, the light has a respective first arcuate cross-sectional shape when light intersects the plane a first time and a respective second arcuate cross-sectional shape when light intersects the plane a second time, at each plane the first and second arcuate cross-sectional shapes curving in the same direction; and
- at each of the spaced-apart planes, the respective first and second cross-sectional shapes do not overlap.

25. The imaging optical system of claim 24, wherein the imaging optical system is a catoptric imaging optical system.

26. The imaging optical system of claim 25, wherein the catoptric imaging optical system is a projection optical system for a microlithography projection exposure apparatus.

* * * * *

UNITED STATES PATENT AND TRADEMARK OFFICE
CERTIFICATE OF CORRECTION

PATENT NO. : 8,717,538 B2  
APPLICATION NO. : 12/767574  
DATED : May 6, 2014  
INVENTOR(S) : Hans-Juergen Mann Page 1 of 1

It is certified that error appears in the above-identified patent and that said Letters Patent is hereby corrected as shown below:

In the Specification

Col. 1, line 8, delete "PCT/EP 2008/008886," and insert -- PCT/EP200800886, --.

Col. 3, line 8, delete "than greater" and insert -- than 160°, and even greater --.

Col. 4, line 21, delete "hashave" and insert -- has have --.

Col. 13, line 24, delete "thereof" and insert -- thereof. --.

Col. 18, line 23, delete "sec- and" and insert -- second --.

Signed and Sealed this  
Twenty-ninth Day of July, 2014

Michelle K. Lee  
*Deputy Director of the United States Patent and Trademark Office*